(12) United States Patent
Park et al.

(10) Patent No.: US 9,184,086 B2
(45) Date of Patent: Nov. 10, 2015

(54) METHODS OF FABRICATING SEMICONDUCTOR DEVICE HAVING SHALLOW TRENCH ISOLATION (STI)

(71) Applicant: Samsung Electronics Co., Ltd., Suwon-Si, Gyeonggi-Do (KR)

(72) Inventors: Tai-Su Park, Seoul (KR); Mi-Young Seo, Hwaseong-si (KR); Sung-Wook Park, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/138,552

(22) Filed: Dec. 23, 2013

(65) Prior Publication Data

US 2014/0227856 A1 Aug. 14, 2014

(30) Foreign Application Priority Data

Feb. 8, 2013 (KR) ........................ 10-2013-0014456

(51) Int. Cl.
*H01L 21/76* (2006.01)
*H01L 21/762* (2006.01)

(52) U.S. Cl.
CPC ................ *H01L 21/76224* (2013.01)

(58) Field of Classification Search
CPC .................. H01L 21/76229; H01L 21/762
USPC ........................... 438/424, 435, 437
See application file for complete search history.

(56) References Cited

U.S. PATENT DOCUMENTS

| 6,482,715 | B2 | 11/2002 | Park et al. | |
| 7,932,168 | B2 | 4/2011 | Eun | |
| 2004/0029353 | A1* | 2/2004 | Zheng et al. | 438/424 |
| 2010/0304548 | A1* | 12/2010 | Turner et al. | 438/435 |
| 2011/0101488 | A1* | 5/2011 | Kim | 257/506 |

FOREIGN PATENT DOCUMENTS

| JP | 2006-324375 A | 11/2006 |
| JP | 2011-165813 A | 8/2011 |
| KR | 10-0557563 B1 | 3/2006 |
| KR | 20060070364 A | 6/2006 |
| KR | 2007-0058116 A | 6/2007 |
| KR | 2008-0002613 A | 1/2008 |
| KR | 2009-0074468 A | 7/2009 |
| KR | 2010-0078532 A | 7/2010 |
| KR | 10-1024335 B1 | 3/2011 |

* cited by examiner

*Primary Examiner* — Bradley K Smith
(74) *Attorney, Agent, or Firm* — Harness, Dickey & Pierce, P.L.C.

(57) ABSTRACT

Methods of fabricating a semiconductor device include forming a field trench in a silicon substrate, forming a first oxide layer in the field trench, forming a first thinned oxide layer by partially removing a surface of the first oxide layer, and forming a first nitride layer on the first thinned oxide layer.

20 Claims, 31 Drawing Sheets

METHODS OF FABRICATING SEMICONDUCTOR DEVICE HAVING SHALLOW TRENCH ISOLATION (STI)

CROSS-REFERENCE TO RELATED APPLICATION

This application claims the benefit of priority under 35 U.S.C. §119 to Korean Patent Application No. 10-2013-0014456 filed on Feb. 8, 2013, the disclosure of which is hereby incorporated by reference in its entirety.

BACKGROUND

1. Field

Example embodiments of the inventive concepts relate to methods of fabricating a semiconductor device having a shallow trench isolation (STI).

2. Description of Related Art

As the integration of a semiconductor device increases, it becomes difficult to form a void-free field insulating material in a shallow trench isolation (STI) region.

SUMMARY

Example embodiments of the inventive concepts provide a method of fabricating a semiconductor device including a shallow trench isolation (STI) having a void-free field insulating material.

Other embodiments of the inventive concepts provide a method of fabricating a semiconductor device including an STI that applies stress on a substrate.

Still other embodiments of the inventive concepts provide various modules, cards, electronic systems, and mobile apparatuses including semiconductor devices formed by a method of fabricating a semiconductor device including an STI which has a void-free field insulating material and/or applies stress on a substrate.

The technical objectives of the inventive concepts are not limited to the above disclosure; other objectives may become apparent to those of ordinary skill in the art based on the following descriptions.

In accordance with an example embodiment of the inventive concepts, a method of fabricating a semiconductor device includes forming a field trench in a silicon substrate, forming a first oxide layer in the field trench, forming a first thinned oxide layer by partially removing a surface of the first oxide layer, and forming a first nitride layer on the first thinned oxide layer.

The forming the first oxide layer may include depositing silicon oxide using an atomic layer deposition (ALD) method.

The method may further include performing an oxidation process for supplying an oxygen ion or an oxygen radical in the silicon substrate through the first oxide layer, after the forming the first oxide layer.

The partially removing the surface of the first oxide layer includes processing the surface of the first oxide layer using a wet etching solution including HF.

The forming the first nitride layer may include depositing silicon nitride using an atomic layer deposition (ALD) method.

The method may further include forming a first thinned nitride layer by partially removing a surface of the first nitride layer.

The partially removing the surface of the first nitride layer includes processing the surface of the first nitride layer using a wet etching solution including $H_3PO_4$.

The method may further include forming a second nitride layer fully filling the field trench on the first thinned nitride layer.

The forming the second nitride layer may include depositing silicon nitride using an atomic layer deposition (ALD) method.

The method may further include forming a second oxide layer on the first thinned oxide layer, before the forming the first nitride layer.

The forming the field trench may include forming a trench mask including silicon oxide or silicon nitride on the silicon substrate, and etching the silicon substrate to form the field trench using the trench mask as an etch mask. The first oxide layer may be formed on an inner wall and a bottom of the field trench, and on a sidewall and an upper surface of the trench mask.

The method may further include removing an upper portion of the first nitride layer to expose the first thinned oxide layer, and selectively removing the first thinned oxide layer to expose a surface of the silicon substrate. An upper end of the first thinned oxide layer may be lower than the surface of the silicon substrate.

In accordance with another example embodiment of the inventive concepts, a method of fabricating a semiconductor device includes providing a substrate having a cell region, an NMOS region, and a PMOS region, forming a cell field trench, an NMOS field trench, and a PMOS field trench in regions of the substrate corresponding to the cell region, the NMOS region, and the PMOS region, respectively, forming a first oxide layer in the cell field trench, the NMOS field trench, and the PMOS field trench, forming a mask pattern exposing the cell field trench and the NMOS field trench, the mask pattern covering the PMOS field trench, forming a first thinned oxide layer by partially removing a surface of the first oxide layer exposed in the cell field trench and the NMOS field trench, removing the mask pattern, and forming a first nitride layer on the first thinned oxide layer disposed in the cell field trench and the NMOS field trench, the first nitride layer being on the first oxide layer disposed in the PMOS field trench.

The forming the first nitride layer may include fully filling the cell field trench, and conformally forming the first nitride layer on the first thinned oxide layer disposed in the NMOS field trench, and on the first oxide layer disposed in the PMOS field trench.

The method may further include forming a silicon oxide layer fully filling the NMOS field trench and the PMOS field trench.

According to yet another example embodiment, a method of fabricating a semiconductor device includes forming an insulative pattern structure filling a field trench in a silicon substrate. The forming an insulative pattern structure includes reducing a first insulating layer at least partially filling the field trench to form a first insulating pattern, and forming at least one nitride layer over the first insulating pattern and in the field trench.

The reducing a first insulating layer may include etching a surface of the first insulating layer such that the first insulating pattern is conformally formed on a surface of the field trench.

The method may further include removing a portion of the insulating pattern so as to expose an upper surface of the substrate. The removing the portion of the insulating pattern may include etching an uppermost end of the insulating pattern in the field trench to be lower than at least one selected from an upper surface the at least one nitride layer and the upper surface of the substrate.

The method may further include reducing a second insulating layer at least partially filling the field trench to form a second insulating pattern conformally on a surface of the field trench, before the forming at least one nitride layer. The removing a portion of the insulating pattern may include etching an uppermost end of the second insulating layer in the field trench to be lower than at least one selected from the upper surface the at least one nitride layer and the upper surface of the substrate.

The forming at least one nitride layer over the insulating pattern may include forming a first nitride layer on the insulating pattern, reducing the first nitride layer to form a first nitride pattern conformally formed on a surface of the insulating pattern, the insulating pattern and the first nitride pattern partially filling the field trench, and forming a second nitride layer filling a remaining portion of the field trench.

Details of other example embodiments are included in the detailed description and drawings.

BRIEF DESCRIPTION OF THE DRAWINGS

The foregoing and other features of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EXAMPLE EMBODIMENTS

Figure 1A:
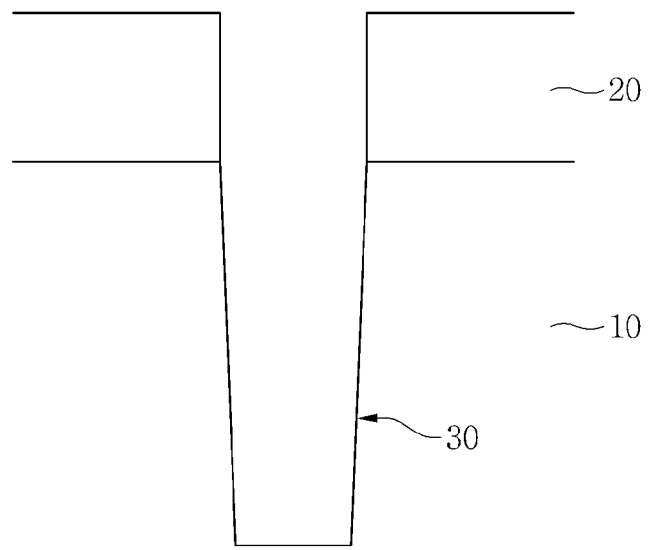
FIGS. 1A to 10H are schematic cross-sectional views for describing methods of fabricating semiconductor devices in accordance with various example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

FIGS. 1A to 1F are schematic cross-sectional views for describing a method of fabricating a semiconductor device in accordance with an example embodiment of the inventive concepts.

Referring to FIG. 1A, the method of fabricating a semiconductor device of the example embodiment may include forming a trench mask 20 on a substrate 10, and forming a field trench 30 in the substrate 10. The trench mask 20 may include a photoresist pattern, a single- or multi-layered silicon oxide pattern, a silicon nitride pattern, or another inorganic material pattern. The forming the field trench 30 may include dry- or wet-etching an exposed substrate 10 using the trench mask 20 as an etch mask. The trench mask 20 may be removed after forming the field trench 30. Inner walls of the field trench 30 may be tapered.

Figure 1B:
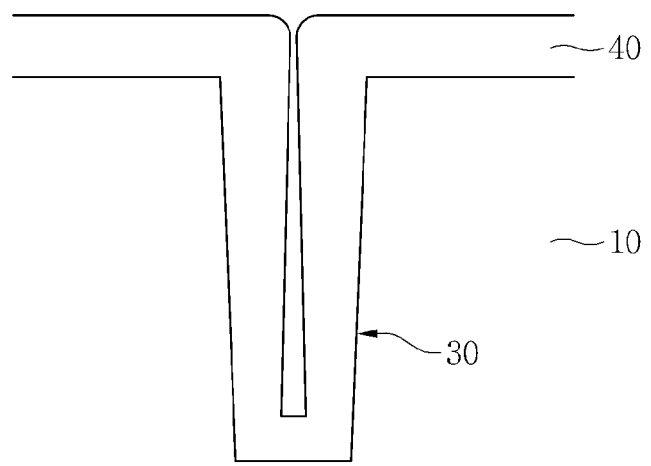

Referring to FIG. 1B, the method may include forming a first insulating layer 40 on the inner walls and bottom of the field trench 30, and a surface of the substrate 10. For example, the first insulating layer 40 may include silicon oxide or silicon nitride. The first insulating layer 40 may be formed using an atomic layer deposition (ALD) process. The first insulating layer 40 may be conformally formed along a profile of the field trench 30. Otherwise, the first insulating layer 40 may have a horizontal thickness that relatively decreases toward a bottom of the field trench 30, and relatively increases toward a top of the field trench 30. For example, the first insulating layer 40 may have an overhang in an entrance of the top of the field trench 30.

Successively, the method may include performing a thermal stabilization process. The performing the thermal stabilization process may include performing a thermal oxidation process. For example, the thermal stabilization process may include penetrating an oxygen ion (O—) or an oxygen radical (O*) into the inner walls and bottom of the field trench 30 by injecting a gas including $O_2$ into a vacuum chamber. Through the thermal stabilization process, interfacial properties and bonding characteristics between the substrate 10 and first insulating layer 40 in the field trench 30 may be improved and stabilized. In some example embodiments, the thermal stabilization process may be omitted.

Figure 1C:
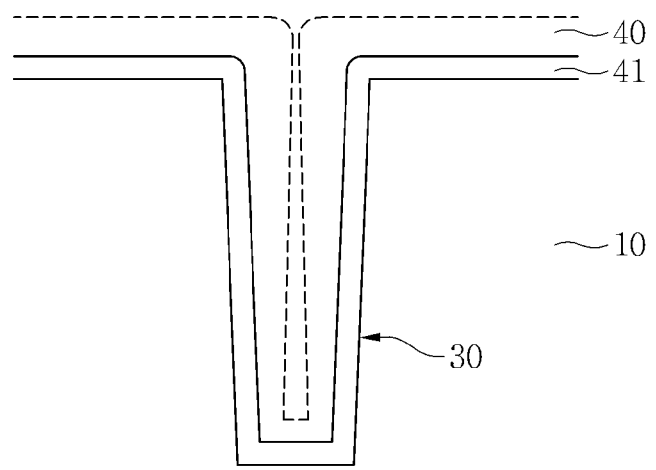

Referring to FIG. 1C, the method may include forming a thinned insulating layer 41 by partially removing a surface of the first insulating layer 40 using an etch process. The etch process may include partially removing the first thinned insulating layer 41 by performing the wet etch process using diluted HF, buffered oxide etchant (BOE), or $H_3PO_4$. Otherwise, the etch process may include partially removing the first insulating layer 40 by performing the dry etch process using an etch gas including carbon (C) or fluoride (F). In this process, the first insulating layer 40 formed in the entrance of the field trench 30 may be more removed, and the first insulating layer 40 formed in the bottom of the field trench 30 may be less removed. The processes described with reference to FIGS. 1B and 1C may be repeated two or more times. By this process, the over-hanged first insulating layer 40 may be deformed (or, alternatively, etched) to be the first thinned insulating layer 41 having a conformal profile along the profile of the field trench 30. The first insulating layer 40 before being removed is virtually marked by a dotted line in FIG. 1C. When the thermal stabilization process is omitted after performing the processes described with reference to FIG. 1B, the thermal stabilization process may be performed after the etch process. The thermal stabilization process may be omitted.

Figure 1D:
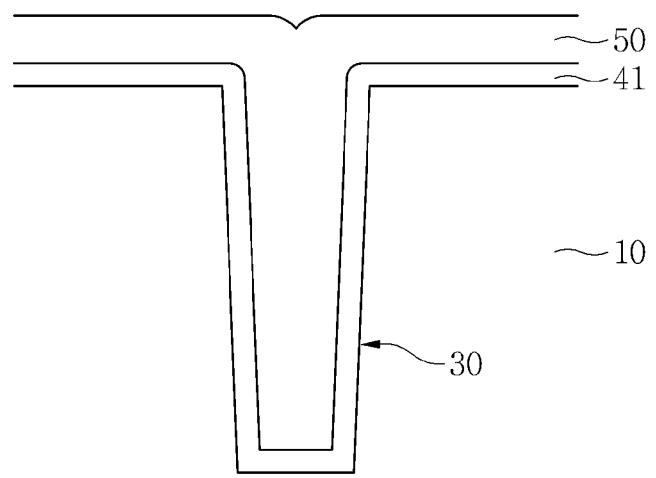

Referring to FIG. 1D, the method may include forming a second insulating layer 50 filling the field trench 30. The second insulating layer 50 may include silicon oxide or silicon nitride. The second insulating layer 50 may be formed by performing a deposition process or a gap-fill process. For example, the second insulating layer 50 may be formed by forming silicon oxide or silicon nitride using an ALD process, or by filling the field trench 30 with a silicon oxide material having good fluidity, such as undoped silicate glass (USG) or tonen silazene (TOSZ).

Figure 1E:
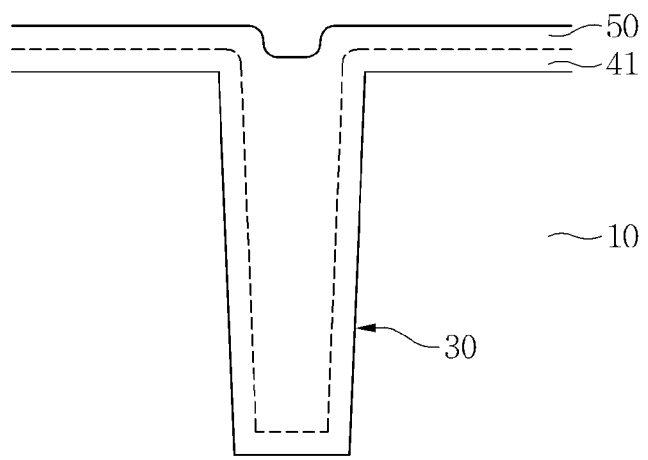

Referring to FIG. 1E, the method may further include performing a densification process. For example, when the second insulating layer 50 is silicon oxide, such as TOSZ, a densification process, such as a thermal annealing process, may be further performed. By the densification process, the interfacial properties and bonding characteristics of the substrate 10 and first thinned insulating layer 41 may be improved, and the second insulating layer 50 may be firmly solidified. In this process, the second insulating layer 50 may have a lowered surface height and be recessed on the field trench 30. When the second insulating layer 50 includes silicon nitride, the densification process may be omitted. When the first thinned insulating layer 41 and the second insulating layer 50 include the same material, an interface therebetween is virtually marked by a dotted line because the interface may disappear.

Figure 1F:
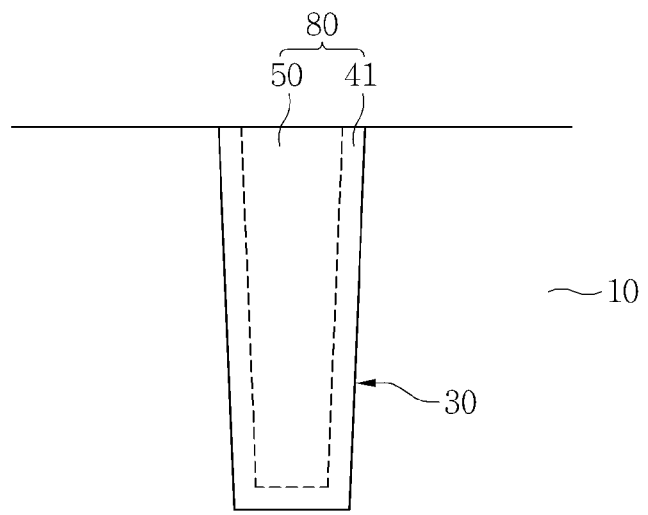

Referring to FIG. 1F, the method may include exposing the surface of the substrate 10. For example, a top of the second insulating layer 50 may be partially removed using a CMP process or an etchback process. The first thinned insulating layer 41 and the second insulating layer 50 may form a field insulating material 80. Successively, processes of forming a gate insulating layer, a tunneling insulating layer, an epitaxial growth layer, or an interlayer insulating layer on the exposed substrate 10 may be selectively performed.

The method of fabricating a semiconductor device of the example embodiment may provide a shallow trench isolation (STI) having a void-free field insulating material 80 in the field trench 30, because the first thinned insulating layer 41 is conformally formed on the inner wall of the field trench 30 by repeatedly performing the processes of depositing and partially removing the first insulating layer 40 in the field trench 30.

FIGS. 2A to 2F are schematic cross-sectional views for describing a method of fabricating a semiconductor device in accordance with another example embodiment of the inventive concepts.

Figure 2A:
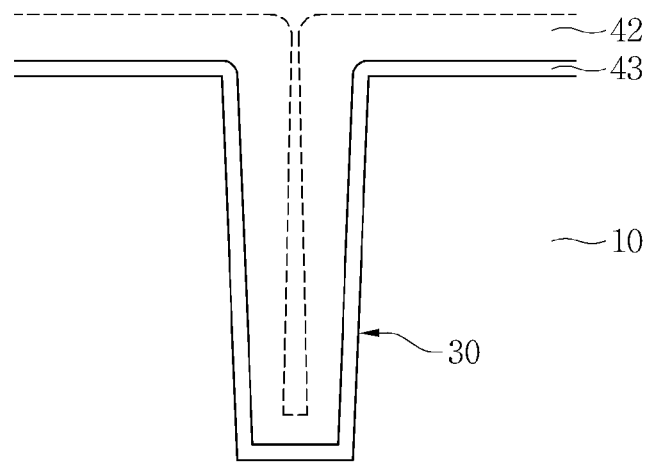

Referring to FIG. 2A, the method of fabricating a semiconductor device of the example embodiment may include, by performing the processes described with reference to FIGS. 1A to 1C, forming a trench mask 20 on a substrate 10, forming a field trench 30, forming an oxide layer 42 on inner walls and bottom of the field trench 30 and a surface of the substrate 10, and forming a thinned oxide layer 43 by partially removing a surface of the oxide layer 42 using a wet or dry oxide-etch process. The oxide layer 42 is virtually marked by a dotted line because the oxide layer 42 is partially removed. The inner walls of the field trench 30 may be tapered. A top surface of the field trench 30 may be arranged in a line or mesh shape in a top view or layout.

The oxide layer 42 may include silicon oxide. The oxide layer 42 may be formed to have a thickness of approximately 10 nm, on average. The oxide layer 42 may be formed by a chemical vapor deposition (CVD) process such as an ALD process.

For example, the forming the oxide layer 42 may include a first cycle process having loading the substrate 10 in a vacuum chamber with a temperature of about 400° to 800° C. and a pressure of about 10 Torr, and forming a silicon layer on the inner walls and bottom of the field trench 30 by injecting $Si_2Cl_6$ gas into the vacuum chamber, a second cycle process having injecting $N_2$ gas into the vacuum chamber and discharging the $Si_2Cl_6$ gas from the vacuum chamber, a third cycle process having oxidizing the silicon layer by injecting $H_2$ gas and $O_2$ gas at the same time into the vacuum chamber, and a fourth cycle process having injecting $N_2$ gas into the vacuum chamber and discharging the $H_2$ gas and $O_2$ gas from the vacuum chamber. The first to fourth cycle processes may be repeated two or more times.

The method may include performing a thermal stabilization process after forming the oxide layer 42. The thermal stabilization process may include performing an oxidation process. For example, the thermal stabilization process may include penetrating oxygen ion (O—) or oxygen radical (O*) into the inner walls and bottom of the field trench 30 by injecting $H_2O$ gas, $O_2$ gas, $O_3$ gas, HCl gas, or combination thereof into the vacuum chamber. By the thermal stabilization process, interfacial properties and bonding characteristics of the substrate 10 and first oxide layer 42 in the field trench 30 may be improved and stabilized.

The wet oxide-etch process may include partially removing the surface of the oxide layer 42 using diluted HF or BOE. The dry oxide-etch process may include partially removing the oxide layer 42 using an etch gas including C and F. In this process, the oxide layer 42 formed close to an entrance of the field trench 30 may be more removed, and the oxide layer 42 formed close to the bottom of the field trench 30 may be less removed. The thinned oxide layer 43 may have a thickness of approximately 5 nm on average. An inner-plasma process may be used in the dry oxide-etch process. For example, a process of generating plasma from the inside of the vacuum chamber by an electric field, may be used without using a remote plasma process in which plasma is generated from the outside of the vacuum chamber and supplied to the vacuum chamber. The remote plasma process may be excluded from the process because of its strong isotropic properties.

The above described thermal stabilization process may be performed after forming the thinned oxide layer 43. For example, the thermal stabilization process may be performed not directly after forming the oxide layer 42 is, but after forming the thinned oxide layer 43.

Figure 2B:
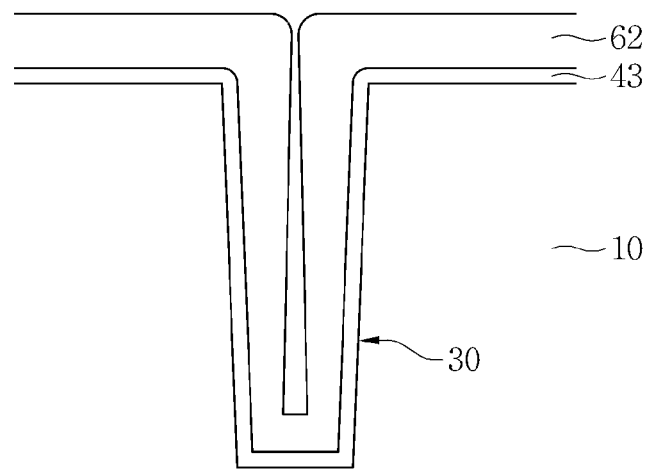

Referring to FIG. 2B, the method may include forming a first nitride layer 62 on the thinned oxide layer 43. The first nitride layer 62 may include silicon nitride. The first nitride layer 62 may be formed by an ALD process. The first nitride layer 62 may also have a conformal profile and/or over-hanging profile like the oxide layer 42. The first nitride layer 62 may have a thickness of approximately 20 nm on average. The forming the first nitride layer 62 may include loading the substrate 10 having the thinned oxide layer 43 thereon into a vacuum chamber, and injecting $Si_2H_6$ gas as a silicon source, and $N_2$ or $NH_3$ gas as a nitrogen source, into the vacuum chamber.

Figure 2C:
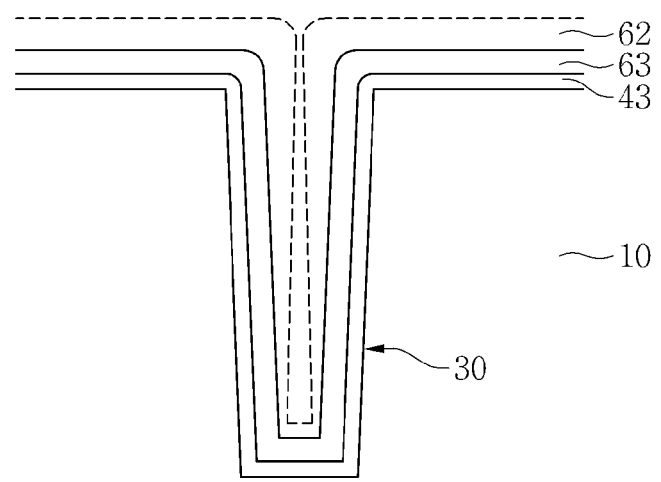

Referring to FIG. 2C, the method may include forming a first thinned nitride layer 63 by partially removing a surface of the first nitride layer 62 using a wet or dry nitride-etch process. The wet nitride-etch process may include partially removing the first nitride layer 62 using diluted $H_3PO_4$. The dry nitride-etch process may include partially removing the first nitride layer 62 using an etch gas including C or F. In this process, the first nitride layer 62 formed close to the entrance of the field trench 30 may be more removed, and the first nitride layer 62 formed close to the bottom of the field trench 30 may be less removed. The dry nitride-etch process may also use the inner-plasma process. The first thinned nitride layer 63 may be remained at a thickness of approximately 10 nm on average. In this process, the over-hanging first nitride layer 62 may be deformed to be the first thinned nitride layer 63 having a conformal profile along the profile of the field trench 30. Because the first nitride layer 62 is partially removed, the first nitride layer 62 is marked with a dotted line.

Figure 2D:
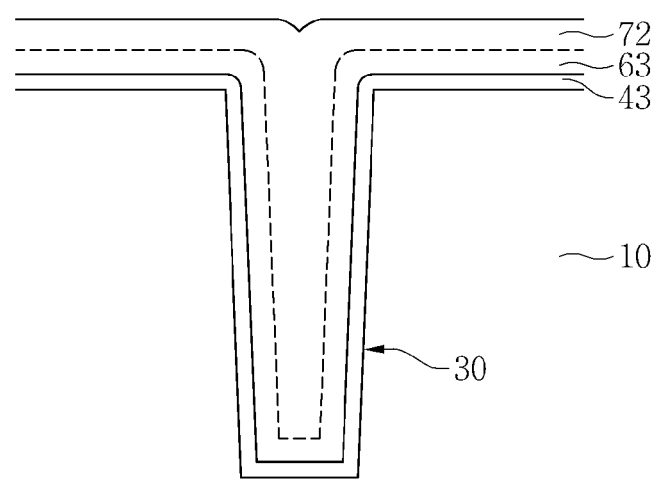

Referring to FIG. 2D, the method may include forming a second nitride layer 72 filling the field trench 30 on the first thinned nitride layer 63. The second nitride layer 72 may include silicon nitride. The second nitride layer 72 may be formed using an ALD process. The second nitride layer 72 may also have a conformal profile and/or over-hanging profile like the oxide layer 42 or the first nitride layer 62. An interface between the first thinned nitride layer 63 and the second nitride layer 72 is virtually marked by a dotted line. For easier understanding of the inventive concepts, the example embodiments are described assuming that the second nitride layer 72 fully fills the field trench 30. In addition, the processes described with reference to FIGS. 2C and 2D may be repeated two or more times.

Figure 2E:
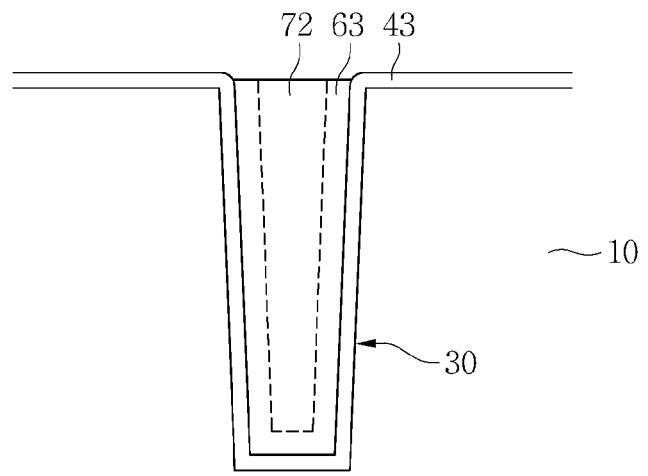

Referring to FIG. 2E, the method may include planarizing a field insulating material 80. The thinned oxide layer 43 may be exposed on the surface of the substrate 10. The planarization of the field insulating material 80 may include removing the second nitride layer 72 and the first thinned nitride layer 63 by performing a CMP or etchback process.

Figure 2F:
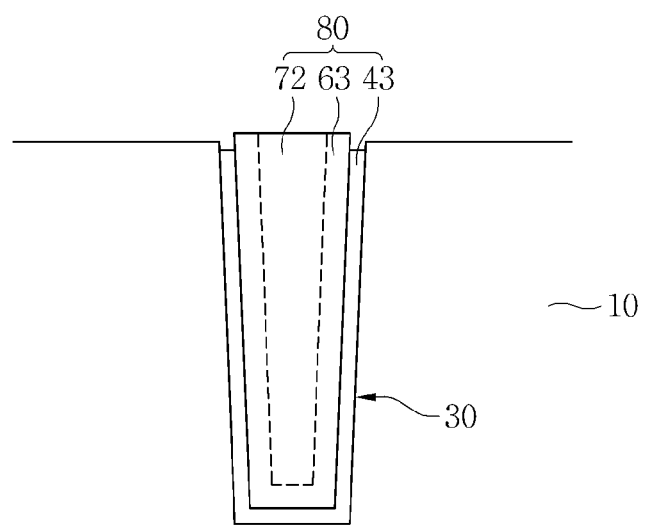

Referring to FIG. 2F, the method may include removing the thinned oxide layer 43 exposed on the substrate 10 to expose the surface of the substrate 10. The uppermost end of the thinned oxide layer 43 may be recessed, in the field trench 30, to be lower than an upper surface of the second nitride layer 72 and/or the surface of the substrate 10. The thinned oxide layer 43, the first thinned nitride layer 63, and the second nitride layer 72 may form the field insulating material 80. Successively, processes of forming a gate insulating layer, a tunneling insulating layer, or an interlayer insulating layer may be performed.

The method of fabricating a semiconductor device of the exemplary embodiment may provide an STI having a void-free field insulating material 80 in the field trench 30, because the thinned oxide layer 43 is conformally formed on the inner wall of the field trench 30 by repeatedly performing the process of depositing and partially removing the oxide layer 42 in the field trench 30, and because the first thinned nitride layer 63 is conformally formed on the inner wall of the field trench 30 by repeatedly performing the process of depositing and partially removing the first nitride layer 62 in the field trench 30.

FIGS. 3A to 3D are schematic cross-sectional views for describing a method of fabricating a semiconductor device in accordance with a further example embodiment of the inventive concepts.

Figure 3A:
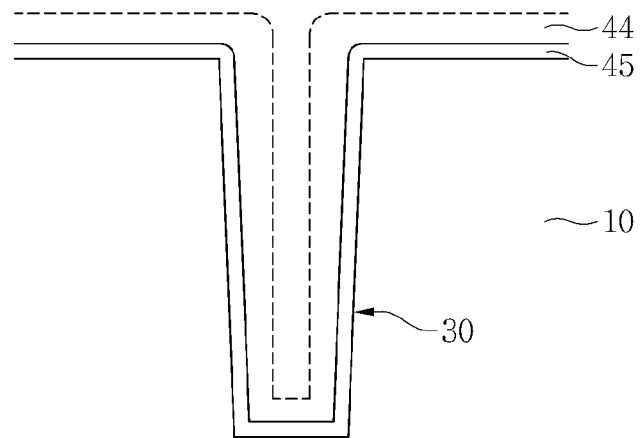

Referring to FIG. 3A, the method of fabricating a semiconductor device of the exemplary embodiment of the inventive concepts may include, by performing the processes described with reference to FIGS. 1A to 1C, forming a trench mask 20 on a substrate 10, forming a field trench 30, forming a first oxide layer 44 on inner walls and bottom of the field trench 30 and a surface of the substrate 10, and forming a first thinned oxide layer 45 by partially removing a surface of the first oxide layer 44 using a wet or dry oxide-etch process. The first oxide layer 44 before being removed is virtually marked by a dotted line. As described above, a thermal stabilization process may be selectively performed before or after forming the first thinned oxide layer 45.

Figure 3B:
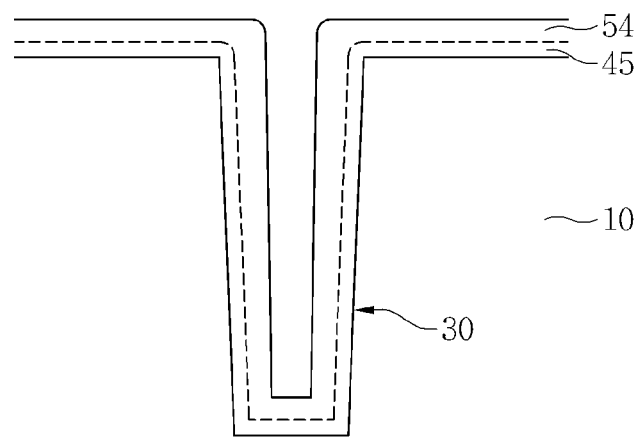

Referring to FIG. 3B, the method may include forming a second oxide layer 54 on the first thinned oxide layer 45. The second oxide layer 54 may also be formed using an ALD process. The second oxide layer 54 may be conformably formed along a profile of the inner walls of the field trench 30. Otherwise, the second oxide layer 54 may have a horizontal thickness that relatively decreases toward a bottom of the field trench 30, and relatively increases toward a top of the field trench 30. The second oxide layer 54 may include silicon oxide. The interface between the first thinned oxide layer 45 and the second oxide layer 54 is virtually marked by a dotted line. As described above, the thermal stabilization process may be performed after forming the second oxide layer 54. That is, the thermal stabilization process may be selectively performed before or after forming the second oxide layer 54.

Figure 3C:
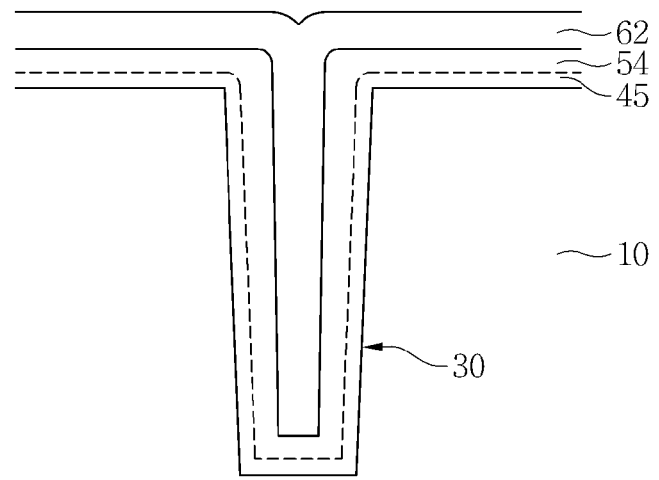

Referring to FIG. 3C, the method may include forming a nitride layer 62 on the second oxide layer 54. The nitride layer 62 may include silicon nitride. The nitride layer 62 may be formed using an ALD process.

Figure 3D:
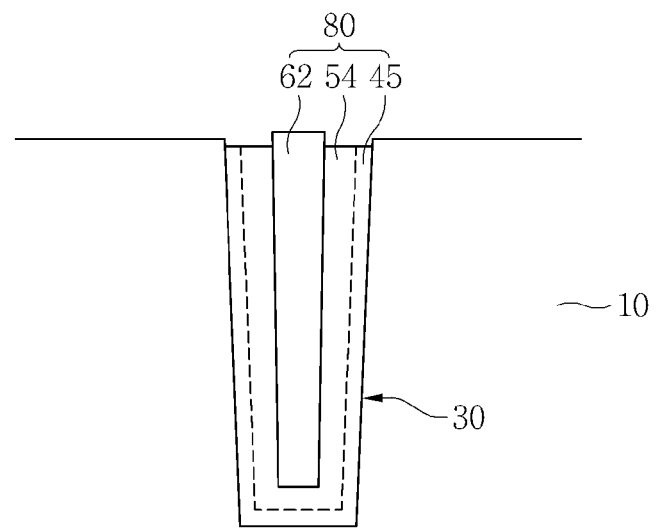

Referring to FIG. 3D, the method may include exposing the first thinned oxide layer 45 on the surface of the substrate 10 by planarizing a field insulating material 80, and exposing the surface of the substrate 10 by removing the first thinned oxide layer 45. The uppermost end of the first thinned oxide layer 45 may be recessed to be lower than an upper surface of the nitride layer 62 and/or the surface of the substrate 10 in the field trench 30. The first thinned oxide layer 45, the second oxide layer 54, and the nitride layer 62 may configure the field insulating material 80. Successively, processes of forming a gate insulating layer, a tunneling insulating layer, or an interlayer insulating layer may be performed.

The method of fabricating a semiconductor device of the exemplary embodiment may provide an STI having a void-free field insulating material 80 in the field trench 30, because the first thinned oxide layer 45 is conformally formed on the inner wall of the field trench 30 by repeatedly performing the process of depositing and partially removing the first oxide layer 44 in the field trench 30.

FIGS. 4A to 4D are schematic cross-sectional views for describing a method of fabricating a semiconductor device in accordance with a still another example embodiment of the inventive concepts.

Figure 4A:
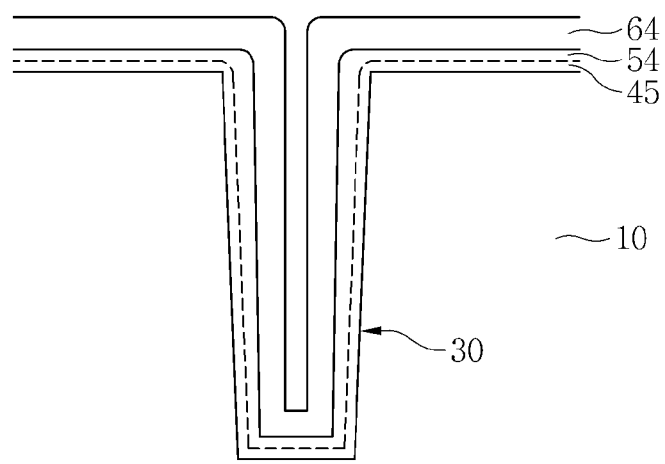

Referring to FIG. 4A, the method of the exemplary embodiment may include, by performing the processes described with reference to FIGS. 1A to 1C and FIGS. 3A to 3C, forming a trench mask 20 on a substrate 10, forming a field trench 30, forming a first oxide layer 44 on inner walls and bottom of the field trench 30 and a surface of the substrate 10, forming a first thinned oxide layer 45 by partially removing a surface of the first oxide layer 44 using a wet or dry oxide-etch process, forming a second oxide layer 54 on the first thinned oxide layer 45, and forming a first nitride layer 64 on the second oxide layer 54. The interface between the first thinned oxide layer 45 and the second oxide layer 54 is virtually marked by a dotted line.

Figure 4B:
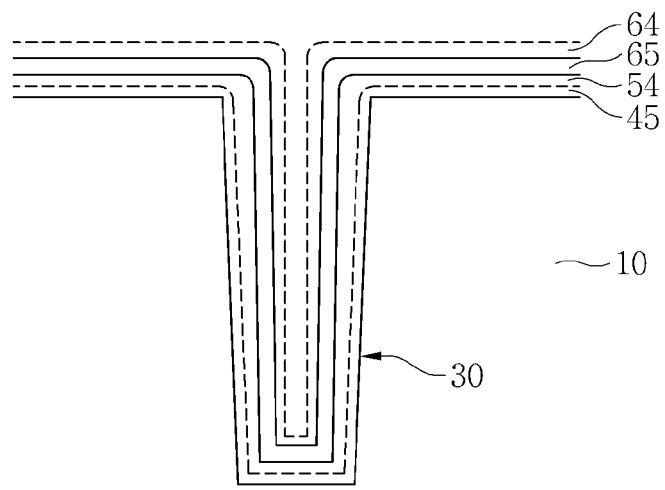

Referring to FIG. 4B, the method may include partially removing the first nitride layer 64 to form a first thinned nitride layer 65. The first nitride layer 64 before being removed is virtually marked by a dotted line.

Figure 4C:
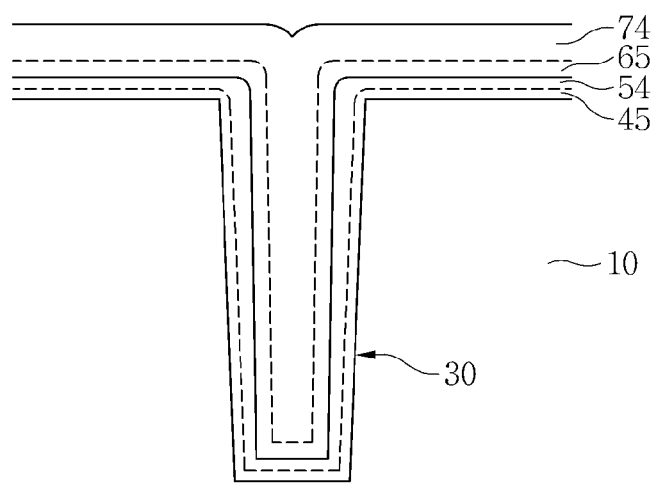

Referring to FIG. 4C, the method may include forming a second nitride layer 74 on the first thinned nitride layer 65. The second nitride layer 74 may fully fill the field trench 30. The interface between the first thinned nitride layer 65 and the second nitride layer 74 is virtually marked by a dotted line.

Figure 4D:
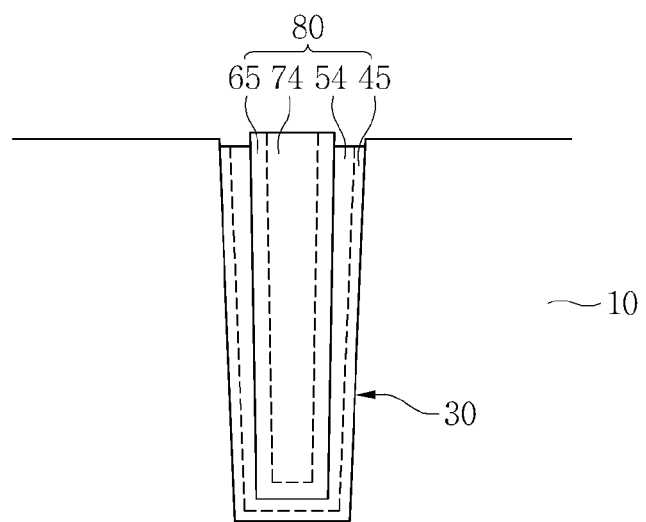

Referring to FIG. 4D, the method may include exposing the second oxide layer 54 and the first thinned oxide layer 45 on the surface of the substrate 10 by planarizing the field insulating material 80, and exposing the surface of the substrate 10 by removing the second oxide layer 54 and the first thinned oxide layer 45. The uppermost ends of the second oxide layer 54 and the first thinned oxide layer 45 may be recessed to be lower than upper surfaces of the second nitride layer 74 and/or the first thinned nitride layer 65, and/or the surface of the substrate 10 in the field trench 30. The first thinned oxide layer 45, the second oxide layer 54, the first thinned nitride layer 65, and the second nitride layer 74 may form the field insulating material 80. Successively, processes of forming a gate insulating layer, a tunneling insulating layer, or an interlayer insulating layer may be performed.

The method of fabricating a semiconductor device of the exemplary embodiment may provide an STI having a void-free field insulating material 80 in the field trench 30, because the first thinned oxide layer 45 is conformally formed on the inner wall of the field trench 30 by repeatedly performing the process of depositing and partially removing the first oxide layer 44 in the field trench 30, and because the first thinned nitride layer 65 is conformally formed on the inner wall of the field trench 30 by repeatedly performing the process of depositing and partially removing the first nitride layer 64 in the field trench 30.

FIGS. 5A to 5D are schematic cross-sectional views for describing a method of fabricating a semiconductor device in accordance with a still further example embodiment of the inventive concepts.

Figure 5A:
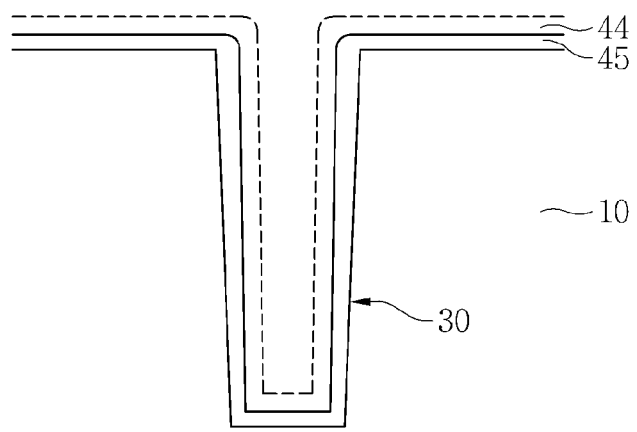

Referring to FIG. 5A, the method of fabricating a semiconductor device of the exemplary embodiment may include, by performing the processes described with reference to FIGS. 1A to 1C, forming a trench mask 20 on a substrate 10, forming a field trench 30, forming a first oxide layer 44 on inner walls and bottom of the field trench 30 and a surface of the substrate 10, and forming a first thinned oxide layer 45 by partially removing a surface of the first oxide layer 44 using a wet or dry oxide-etch process. The first oxide layer 44 before being removed is virtually marked by a dotted line.

Figure 5B:
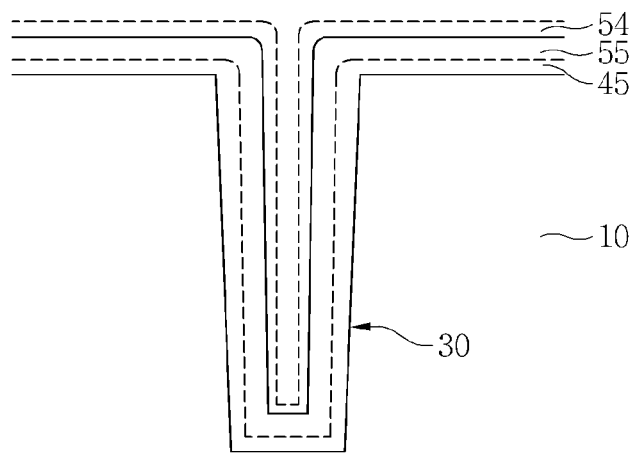

Referring to FIG. 5B, the method may include forming a second oxide layer 54 on the first thinned oxide layer 45, and forming a second thinned oxide layer 55 by partially removing the second oxide layer 54. An interface between the first thinned oxide layer 45 and the second thinned oxide layer 55, and the second oxide layer 54 before being removed are virtually marked by dotted lines.

Figure 5C:
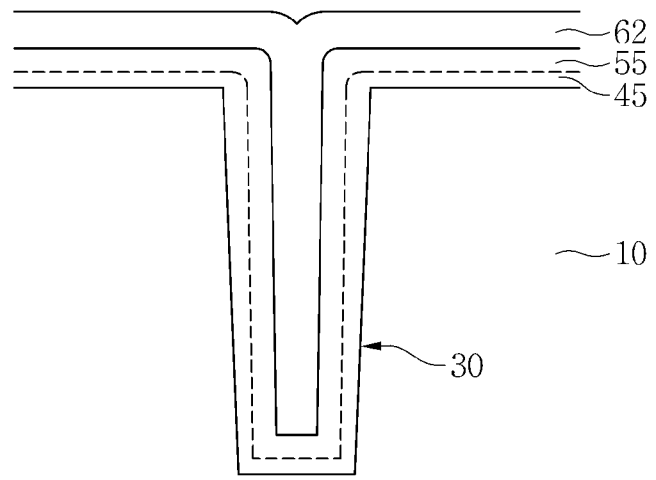

Referring to FIG. 5C, the method may include forming a nitride layer 62 on the second thinned oxide layer 55.

Figure 5D:
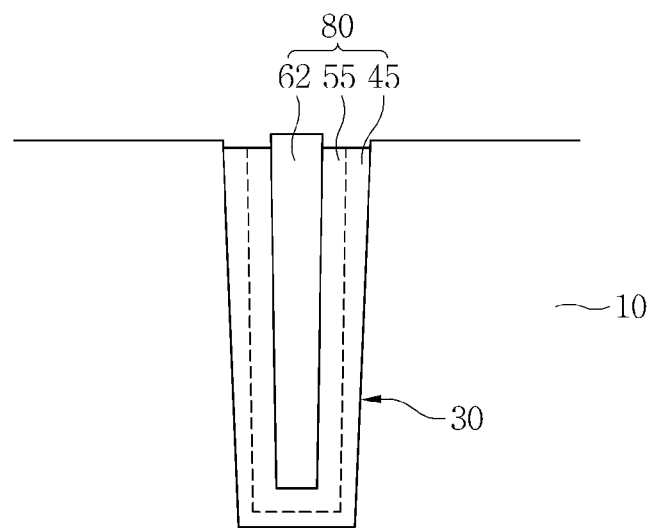

Referring to FIG. 5D, the method may include planarizing a field insulating material 80 to expose the first and/or second thinned oxide layers 45 and 55, and removing the exposed first and/or second thinned oxide layers 45 and 55 to expose the surface of the substrate 10. The uppermost ends of the first thinned oxide layer 45 and/or the second thinned oxide layer 55 may be recessed, in the field trench 30, to be lower than an upper surface of the nitride layer 62 and/or the surface of the substrate 10. The first thinned oxide layer 45, the second thinned oxide layer 55, and the nitride layer 62 may configure the field insulating material 80. Successively, processes of forming a gate insulating layer, a tunneling insulating layer, or an interlayer insulating layer may be performed.

The method of fabricating a semiconductor device of the exemplary embodiment may provide an STI having a void-free field insulating material 80 in the field trench 30, because the first thinned oxide layer 45 and the second thinned oxide layer 55 are conformally formed on the inner wall of the field trench 30 by repeatedly performing the process of depositing and partially removing the first oxide layer 44 and the second oxide layer 54 in the field trench 30.

FIGS. 6A to 6D are schematic cross-sectional views for describing a method of fabricating a semiconductor device in accordance with a yet further example embodiment of the inventive concepts.

Figure 6A:
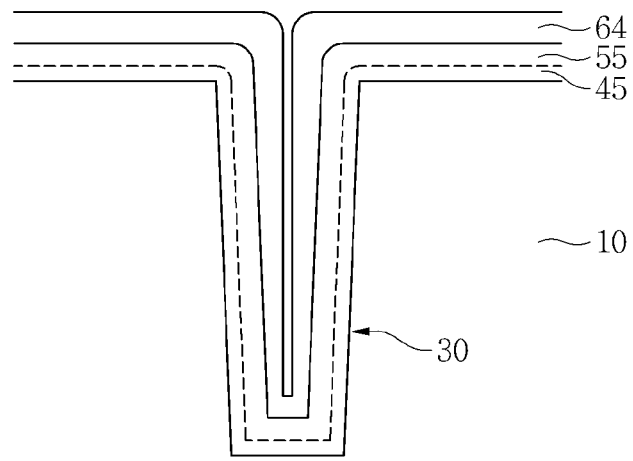

Referring to FIG. 6A, the method of fabricating a semiconductor device of the exemplary embodiment of the inventive concepts may include, by performing the processes described with reference to FIGS. 1A to 1C and FIGS. 5A and 5B, forming a trench mask 20 on a substrate 10, forming a field trench 30, forming a first oxide layer 44 on inner walls and bottom of the field trench 30 and a surface of the substrate 10, forming a first thinned oxide layer 45 by partially removing a surface of the first oxide layer 44 using a wet or dry oxide-etch process, forming a second oxide layer 54 on the first thinned oxide layer 45, forming a second thinned oxide layer 55 by partially removing a surface of the second oxide layer 54, and forming a first nitride layer 64 on the second thinned oxide layer 55. The interface between the thinned oxide layer 45 and the second thinned oxide layer 55 is virtually marked by a dotted line.

Figure 6B:
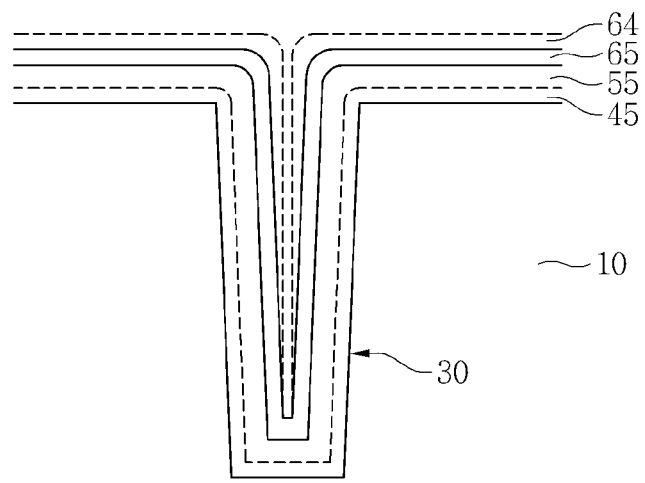

Referring to FIG. 6B, the method may include forming a first thinned nitride layer 65 by partially removing the first nitride layer 64. The first nitride layer 64 before being removed is virtually marked by a dotted line.

Figure 6C:
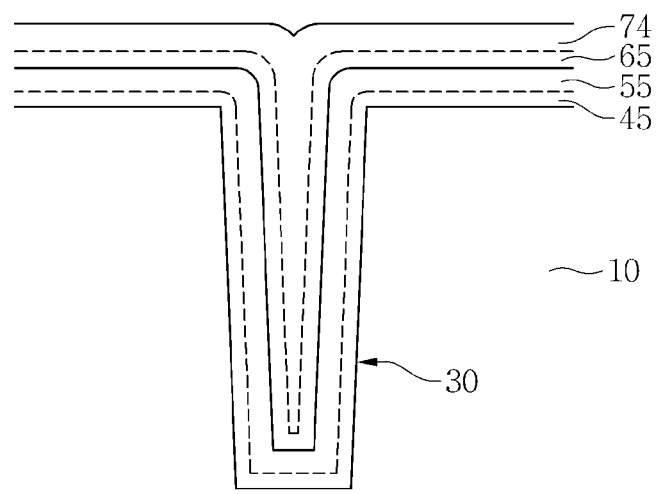

Referring to FIG. 6C, the method may include forming a second nitride layer 74 on the first thinned nitride layer 65. The second nitride layer 74 may fully fill the field trench 30. An interface between the first thinned nitride layer 65 and the second nitride layer 74 is virtually marked by a dotted line.

Figure 6D:
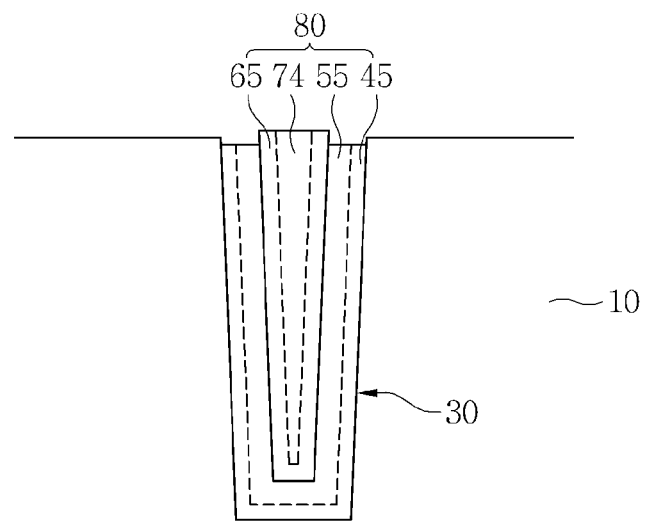

Referring to FIG. 6D, the method may include exposing the first thinned oxide layer 45 and/or the second thinned oxide layer 55 on the surface of the substrate 10 by planarizing a field insulating material 80, and exposing the surface of the substrate 10 by removing the exposed first thinned oxide layer 45 and/or second thinned oxide layer 55. The uppermost ends of the first thinned oxide layer 45 and/or the second thinned oxide layer 55 may be recessed, in the field trench 30, to be lower than an upper surface of the second nitride layer 74 and/or the surface of the substrate 10. The first thinned oxide layer 45, the second thinned oxide layer 55, the first thinned nitride layer 65, and the second nitride layer 74 may configure the field insulating material 80. Successively, processes of forming a gate insulating layer, a tunneling insulating layer, or an interlayer insulating layer may be performed.

The method of fabricating a semiconductor device of the exemplary embodiment may provide an STI having a void-free field insulating material 80 in the field trench 30, because the first thinned oxide layer 45 and the second thinned oxide layer 55 are conformally formed on the inner wall of the field trench 30 by repeatedly performing the process of depositing and partially removing the first oxide layer 44 and the second oxide layer 54 in the field trench 30, and because the first thinned nitride layer 65 is conformably formed on the inner wall of the field trench 30 by repeatedly performing the process of depositing and partially removing the first nitride layer 64 in the field trench 30.

FIGS. 7A to 7H are schematic cross-sectional views for describing a method of fabricating a semiconductor device in accordance with an example embodiment of the inventive concepts.

Figure 7A:
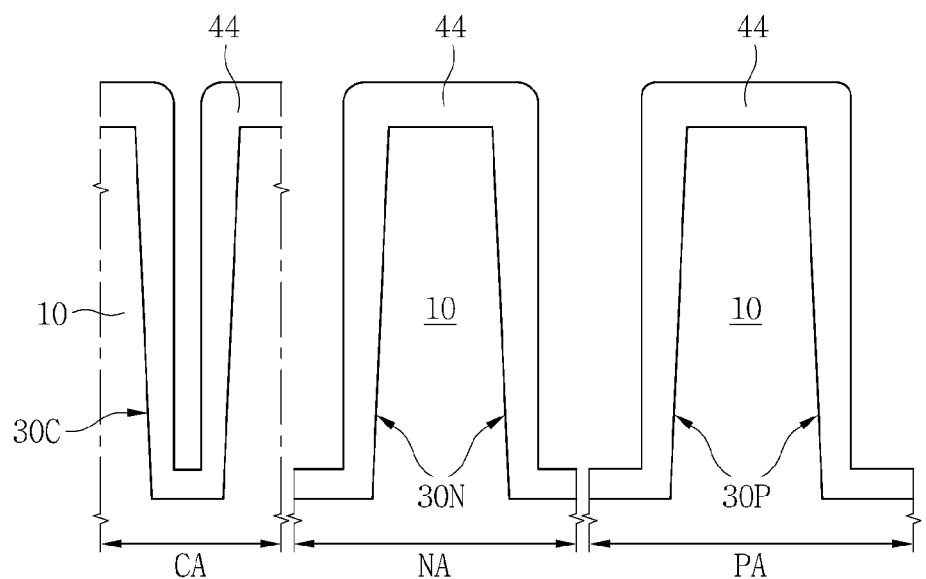

Referring to FIG. 7A, the method of fabricating a semiconductor device of the exemplary embodiment may include preparing a substrate 10 having a cell region CA, an NMOS region NA, and a PMOS region PA, forming a trench mask 20 on the substrate 10 by performing the processes described with reference to FIG. 1A, forming a cell field trench 30C, an NMOS field trench 30N, and a PMOS field trench 30P in the substrate 10, removing the trench mask 20, and forming a first oxide layer 44 on the insides of the field trenches 30C, 30N, and 30P and on the surface of the substrate 10 by performing the processes described with reference to FIG. 1B. As described above, the first oxide layer 44 may be formed using an ALD method. Successively, a thermal stabilization process may be performed. The thermal stabilization process may include an oxidation process. Through the thermal stabilization process, interfacial properties and bonding characteristics of the substrate 10 and first oxide layer 44 may be improved and stabilized.

Figure 7B:
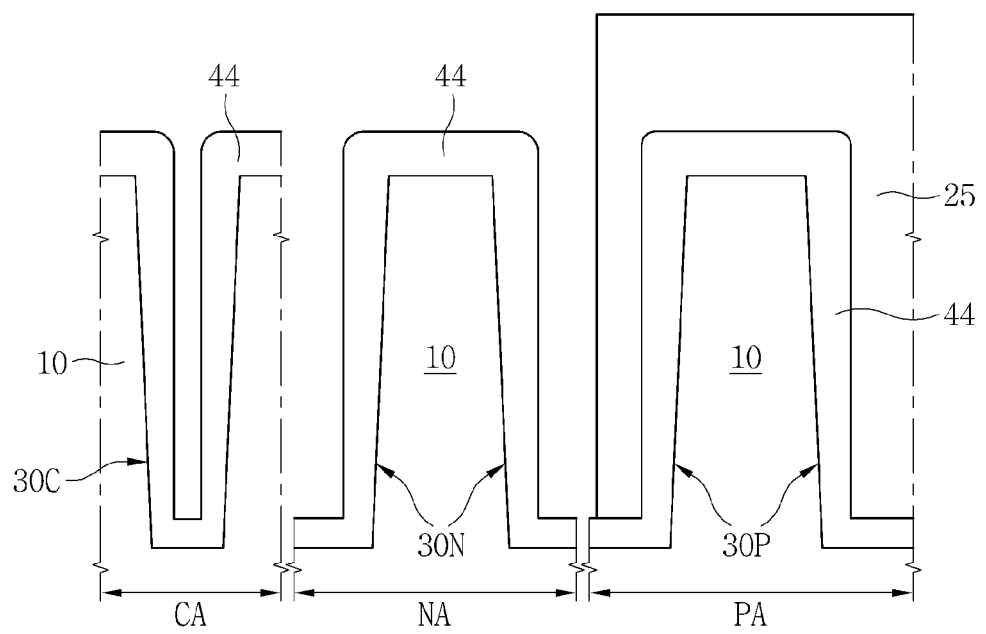

Referring to FIG. 7B, the method may include forming a mask pattern 25 opening the cell region CA and the NMOS region NA. The mask pattern 25 may include photoresist.

Figure 7C:
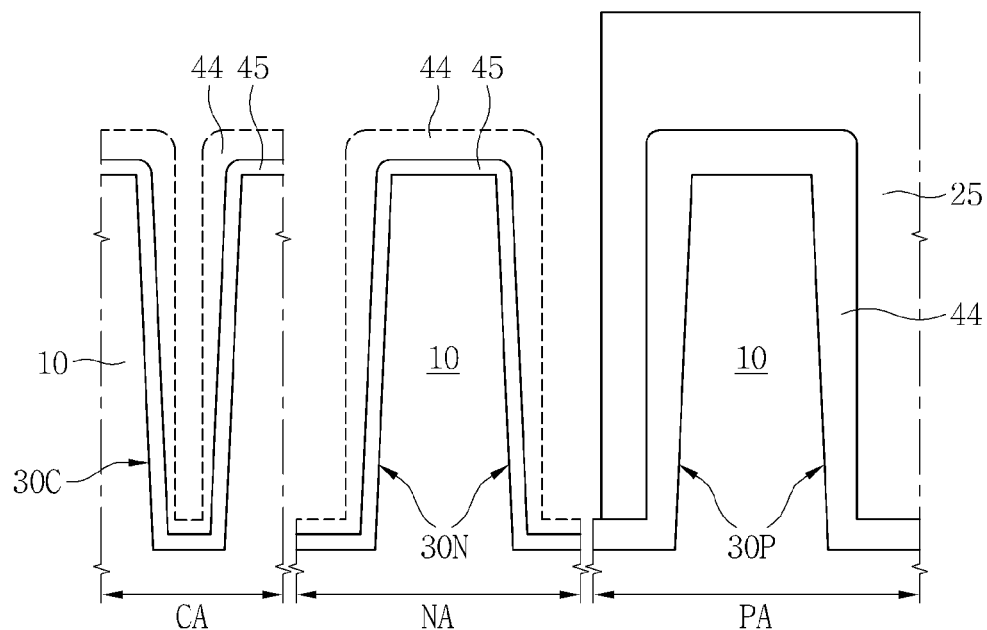

Referring to FIG. 7C, the method may include forming a first thinned oxide layer 45 by partially removing the first oxide layer 44 exposed on the cell region CA and the NMOS region NA. Because the PMOS region PA may be protected by the mask pattern 25, the first oxide layer 44 may fully remain. In the cell region CA and NMOS region NA, the first oxide layer 44 before being removed is virtually marked by a dotted line. Successively, the mask pattern 25 may be removed.

Figure 7D:
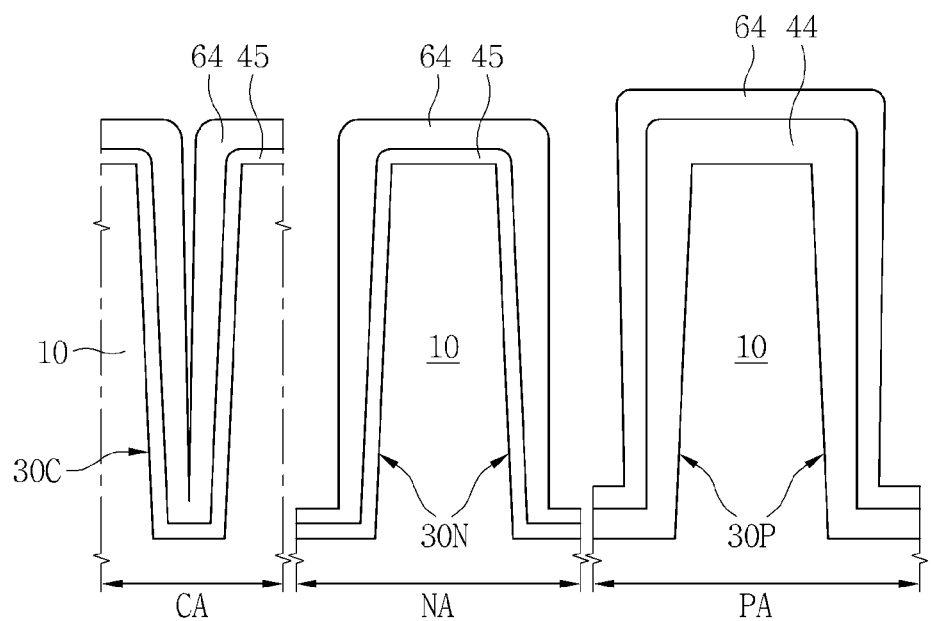

Referring to FIG. 7D, the method may include forming a first nitride layer 64 on the first thinned oxide layer 45 in the cell region CA and NMOS region NA, and on the first oxide layer 44 in the PMOS region PA. As described above, the first nitride layer 64 may be formed using an ALD process.

Figure 7E:
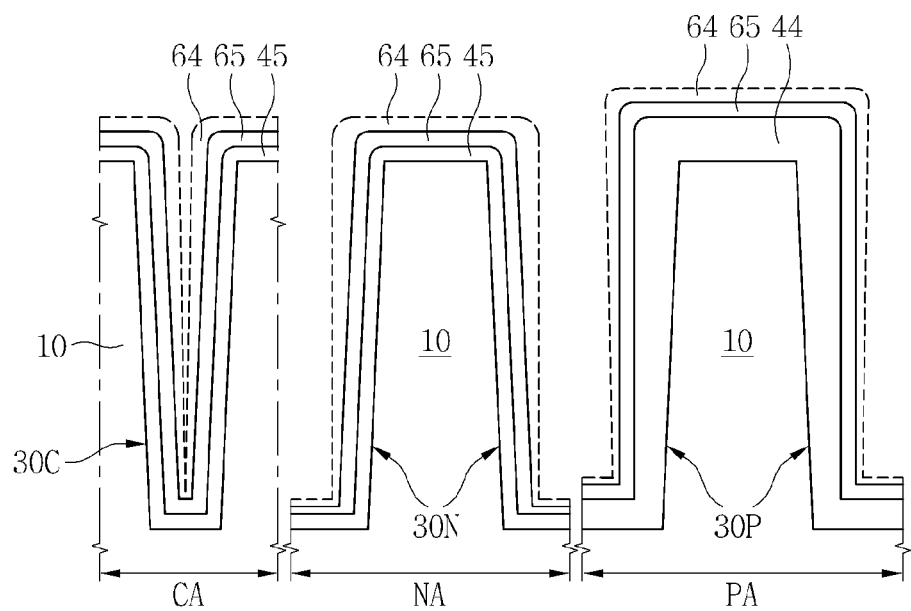

Referring to FIG. 7E, the method may include forming a first thinned nitride layer 65 by partially removing the first nitride layer 64. The first nitride layer 64 before being removed is virtually marked by a dotted line.

Figure 7F:
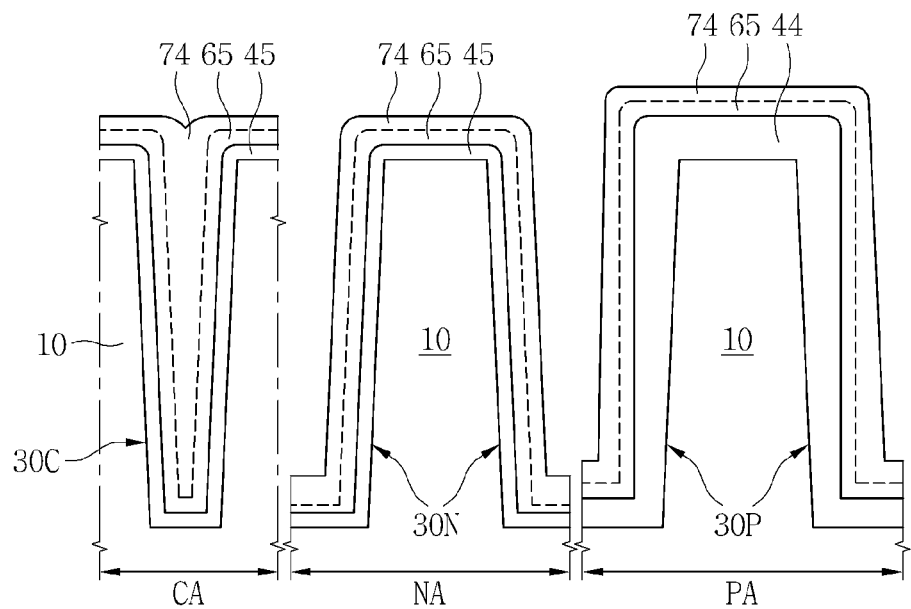

Referring to FIG. 7F, the method may include forming a second nitride layer 74 on the first thinned nitride layer 65. The second nitride layer 74 may fully fill the cell field trench 30C in the cell region CA. The field trenches 30C, 30N, and 30P may not be fully filled in the NMOS region NA and the PMOS region PA. In the cell region CA, the first thinned oxide layer 45, the first thinned nitride layer 65, and the second nitride layer 74 may configure a cell field insulating material 80C. The interface between the first thinned nitride layer 65 and the second nitride layer 74 is virtually marked by a dotted line.

Figure 7G:
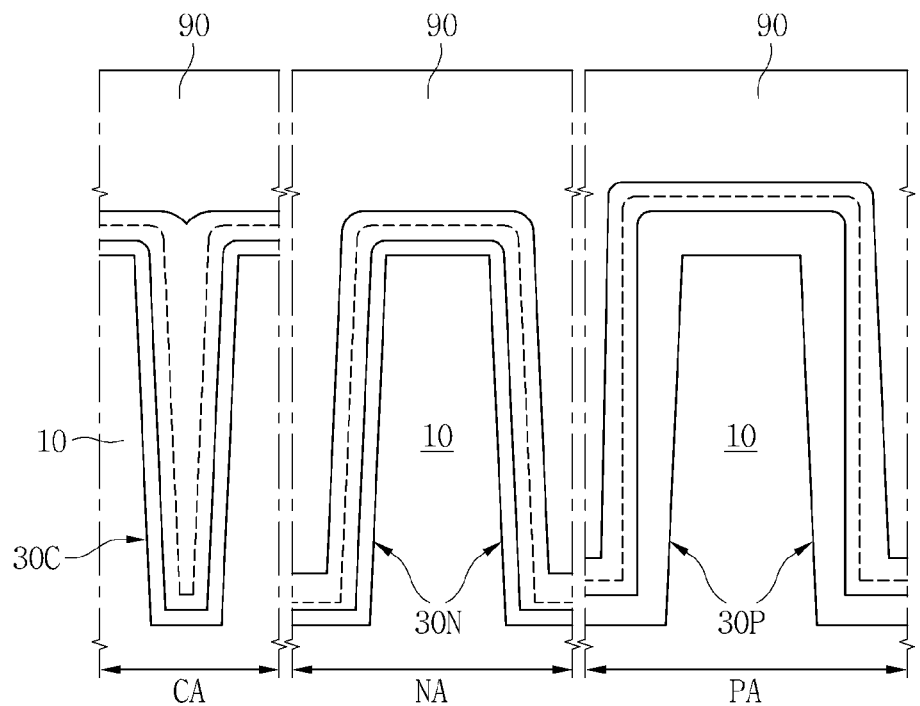

Referring to FIG. 7G, the method may include forming a filling insulating material 90 which fills the NMOS field trench 30N and the PMOS field trench 30P, on second nitride layer 74. The filling insulating material 90 may include silicon oxide having good fluidity, such as TOSZ or silicate.

Figure 7H:
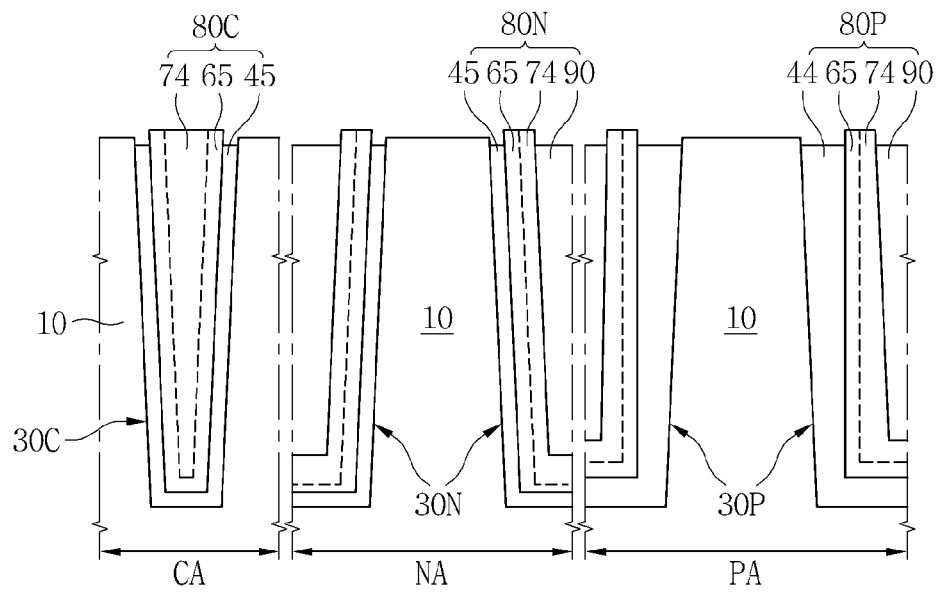

Referring to FIG. 7H, the method may include removing upper portions of the filling insulating material 90, the second nitride layer 74, and the first thinned nitride layer 65 by performing a planarization process to expose the first thinned oxide layer 45 in the cell region CA and NMOS region NA, and the first oxide layer 44 in the PMOS region PA. The method may further include partially removing upper portions of the exposed first oxide layer 44 and first thinned oxide layer 45 in such a way that upper ends of the first oxide layer 44 and the first thinned oxide layer 45 are recessed to be lower than an upper surface of the second nitride layer 74 and the surface of the substrate 10. In the NMOS region NA, the first thinned oxide layer 45, the first thinned nitride layer 65, the second nitride layer 74, and the filling insulating material 90 may configure an NMOS field insulating material 80N. In the PMOS region PA, the first oxide layer 44, the first thinned nitride layer 65, the second nitride layer 74, and the filling insulating material 90 may configure a PMOS field insulating material 80P. Successively, processes of forming a gate insulating layer, a tunneling insulating layer, or an interlayer insulating layer may be performed.

Because the method of fabricating a semiconductor device of the example embodiment may provide a relatively thin oxide layer 45 in the NMOS region, tensile stress may be applied to the substrate 10 by the nitride layers 65 and 74. Accordingly, the semiconductor device fabricated according to the embodiment may include an NMOS in which carrier mobility is improved.

FIGS. 8A to 8G are schematic cross-sectional views for describing a method of fabricating a semiconductor device in accordance with another example embodiment of the inventive concepts.

Figure 8A:
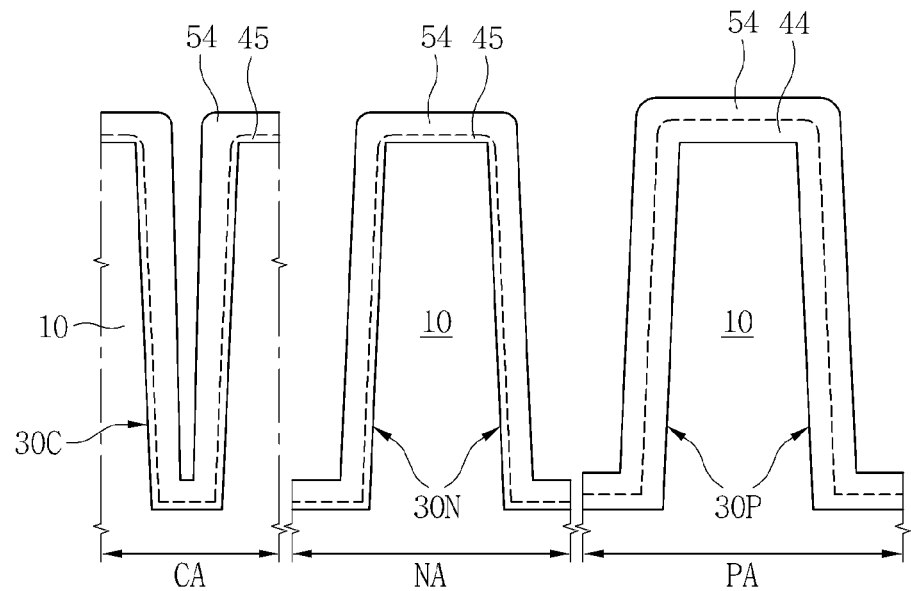

Referring to FIG. 8A, the method of fabricating a semiconductor device of the exemplary embodiment may include preparing a substrate 10 having a cell region CA, an NMOS region NA, and a PMOS region PA, with reference to FIGS. 1A, 1B, and 7A to 7C. The method may further include forming a cell field trench 30C, an NMOS field trench 30N, and a PMOS field trench 30P in the substrate 10 by performing the processes described with reference to FIG. 1A, forming a first oxide layer 44 in the field trenches 30C, 30N, and 30P and on a surface of the substrate 10 by performing the processes described with reference to FIG. 1B, forming a mask pattern 25 which opens the cell region CA and the NMOS region NA and covers the PMOS region PA, forming a first thinned oxide layer 45 by partially removing the first oxide layer 44 exposed on the cell region CA and NMOS region NA, removing the mask pattern 25, and forming a second oxide layer 54. An interface between the first thinned oxide layer 45 and the second oxide layer 54 is virtually marked by a dotted line.

Figure 8B:
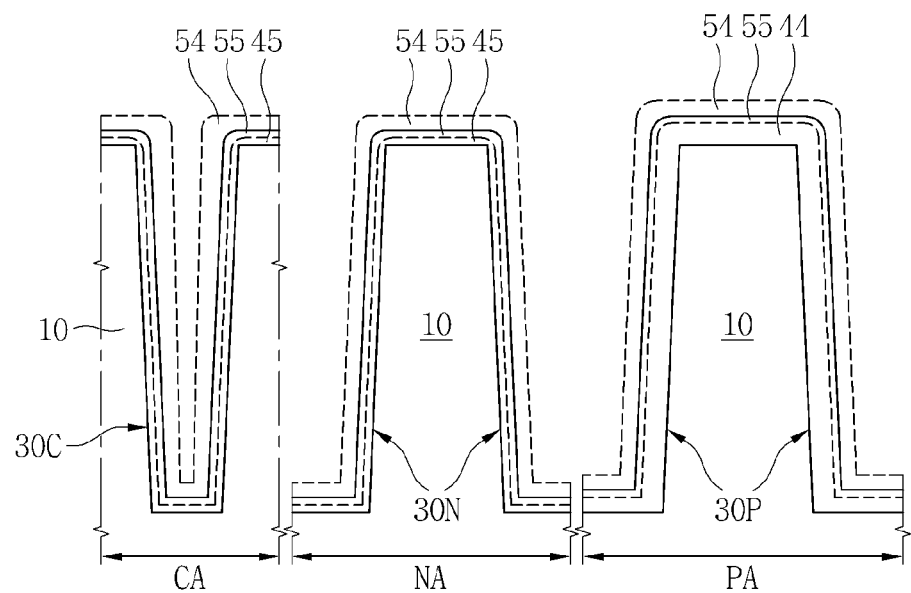

Referring to FIG. 8B, the method may include forming a second thinned oxide layer 55 by partially removing the second oxide layer 54. The second oxide layer 54 before being removed is virtually marked by a dotted line.

Figure 8C:
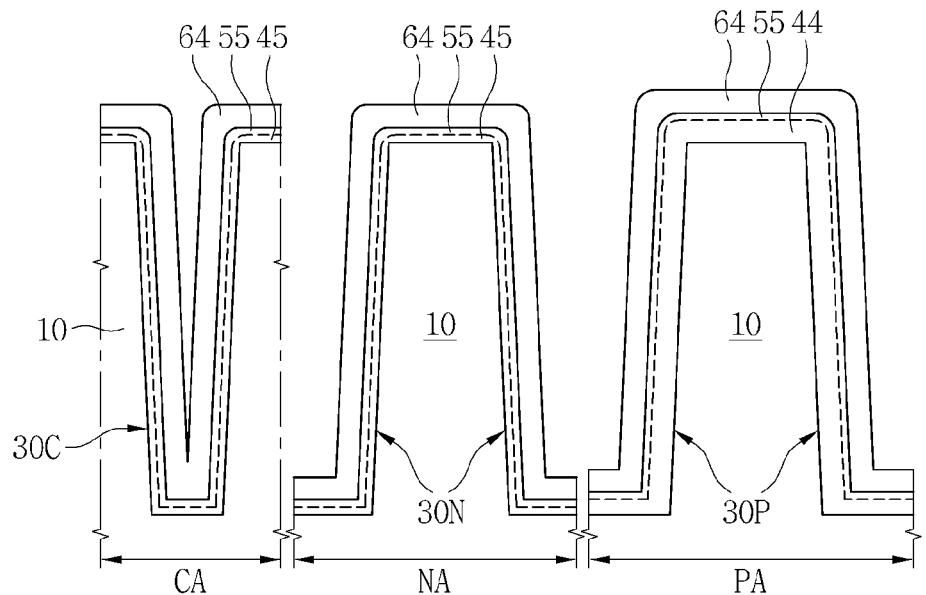

Referring to FIG. 8C, the method may include forming a first nitride layer 64 on the second thinned oxide layer 55.

Figure 8D:
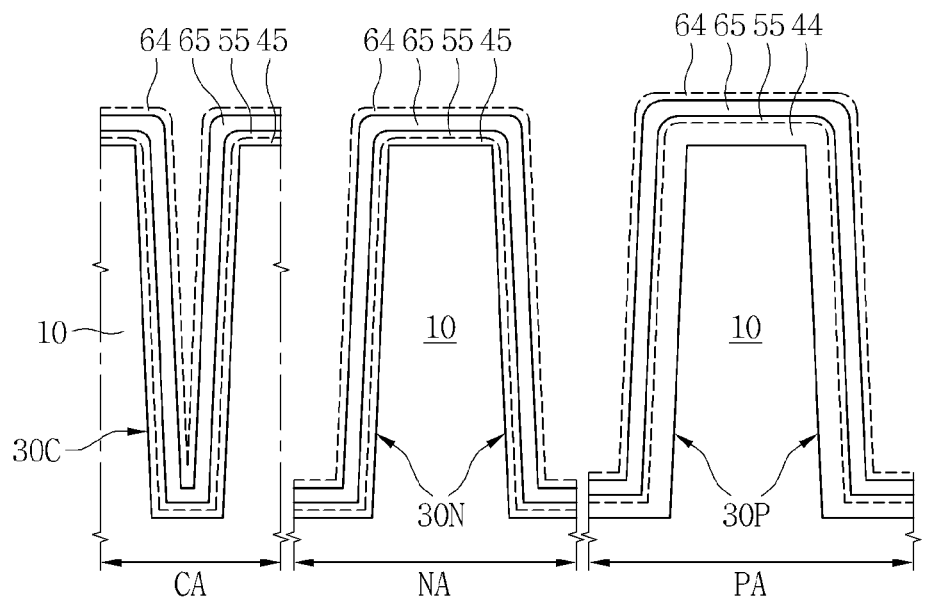

Referring to FIG. 8D, the method may include forming a first thinned nitride layer 65 by partially removing the first nitride layer 64. The first nitride layer 64 before being removed is virtually marked by a dotted line.

Figure 8E:
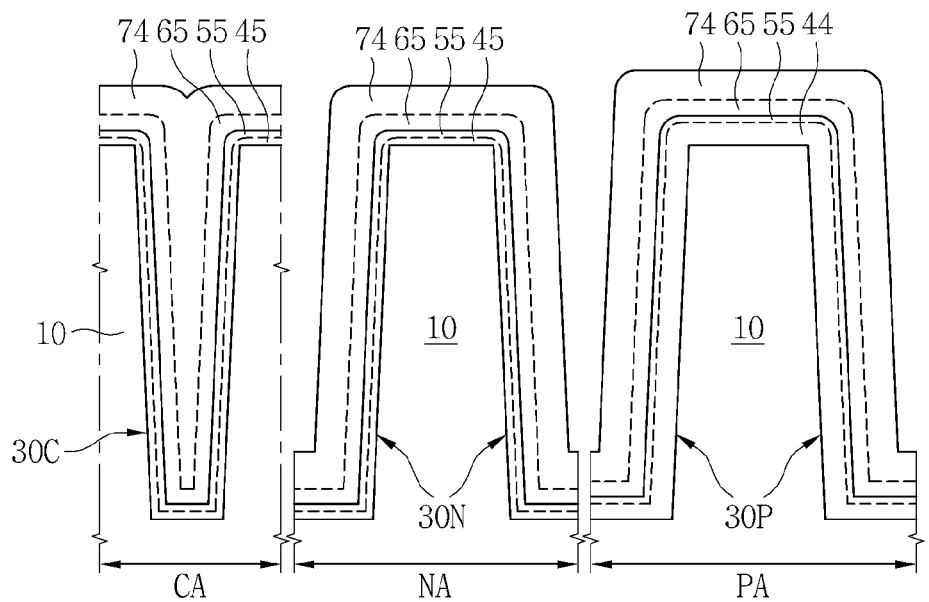

Referring to FIG. 8E, the method may include forming a second nitride layer 74 on the first thinned nitride layer 65. The second nitride layer 74 may fully fill the cell field trench 30C. The NMOS field trench 30N and the PMOS field trench 30P may not be fully filled. In the cell region CA, the first thinned oxide layer 45, the second thinned oxide layer 55, the first thinned nitride layer 65, and the second nitride layer 74 may form a field insulating material 80. An interface between the first thinned nitride layer 65 and the second nitride layer 74 is virtually marked by a dotted line.

Figure 8F:
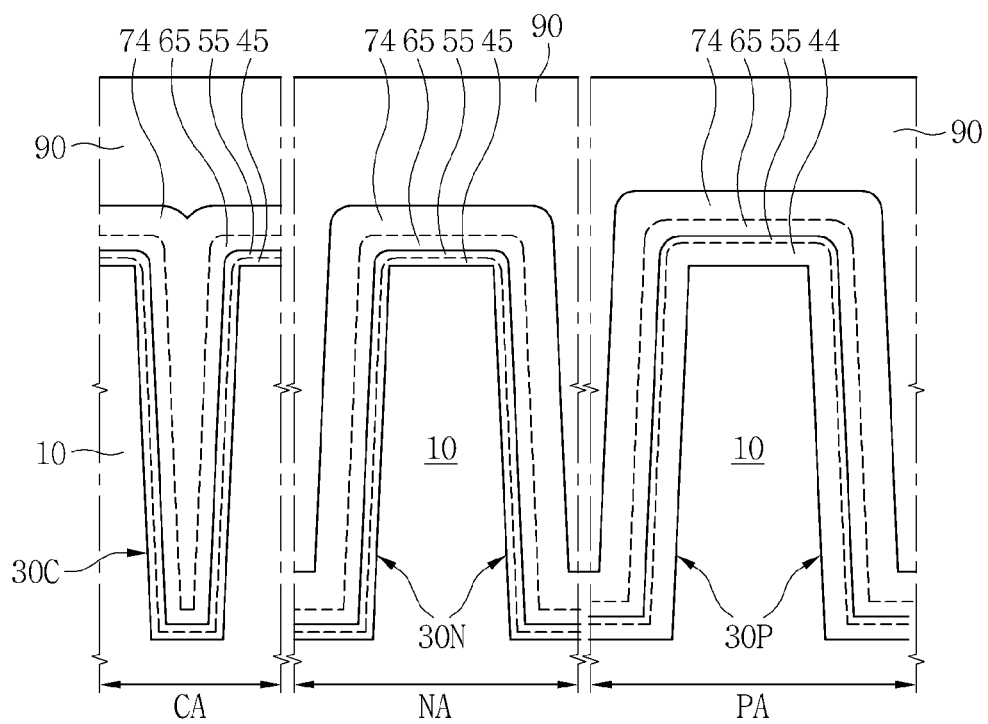

Referring to FIG. 8F, the method may include forming a filling insulating material 90 which fills the NMOS field trench 30N and the PMOS field trench 30P, on the second nitride layer 74.

Figure 8G:
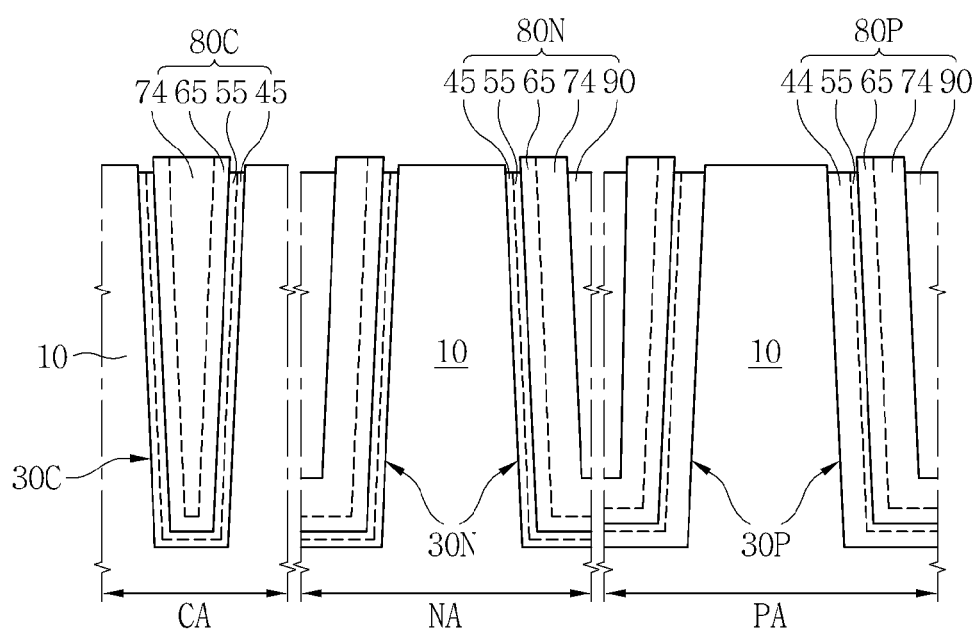

Referring to FIG. 8G, the method may include partially removing or selectively exposing upper portions of the filling insulating material 90, the second nitride layer 74, the first thinned nitride layer 65, the second thinned oxide layer 55, the first thinned oxide layer 45, and/or the first oxide layer 44 by performing a planarization process, and exposing the surface of the substrate 10 by partially removing the upper portions of the second thinned oxide layer 55, the first thinned oxide layer 45, and/or the first oxide layer 44. Upper ends of the second thinned oxide layer 55, the first thinned oxide layer 45, and/or the first oxide layer 44 may be located lower than upper surfaces of the second nitride layer 74 and the first thinned nitride layer 65, and/or the surface of the substrate 10. The first thinned oxide layer 45, the second thinned oxide layer 55, the first thinned nitride layer 65, and the second nitride layer 74 may form a cell field insulating material 80C. The first thinned oxide layer 45, the second thinned oxide layer 55, the first thinned nitride layer 65, the second nitride layer 74, and the filling insulating material 90 may form an NMOS field insulating material 80N, and the first oxide layer 44, the second thinned oxide layer 55, the first thinned nitride layer 65, the second nitride layer 74, and the filling insulating material 90 may form a PMOS field insulating material 80P. Successively, processes of forming a gate insulating layer, a tunneling insulating layer, or an interlayer insulating layer may be performed.

Because the method of fabricating a semiconductor device of the exemplary embodiment may provide relatively thin oxide layers 45 and 55 in the NMOS region, tensile stress may be applied to the substrate 10 by the nitride layers 65 and 74. Accordingly, the semiconductor device fabricated according to the embodiment may include an NMOS in which carrier mobility is improved.

FIGS. 9A to 9D are schematic cross-sectional views for describing a method of fabricating a semiconductor device in accordance with yet another example embodiment of the inventive concepts.

Figure 9A:
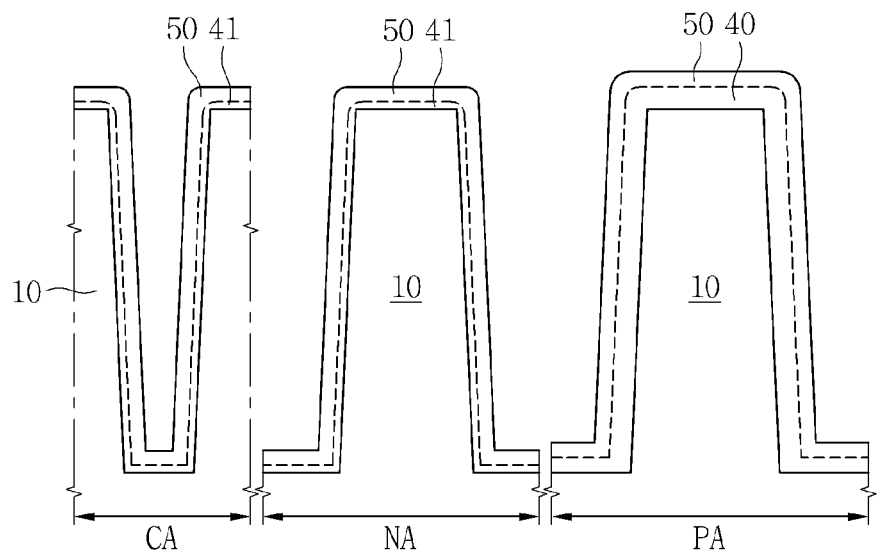

Referring to FIG. 9A, the method of fabricating a semiconductor device of the exemplary embodiment may include preparing a substrate 10 having a cell region CA, an NMOS region NA, and a PMOS region PA, by performing processes described with reference to FIGS. 7A to 7C. The method may further include forming a cell field trench 30C, an NMOS field trench 30N, and a PMOS field trench 30P in the substrate 10 by performing the processes described with reference to FIG. 1A, forming a first insulating layer 40 in the field trenches 30C, 30N, and 30P and on a surface of the substrate 10 by performing the processes described with reference to FIG. 1B, forming a mask pattern 25 opening the cell region CA and the NMOS region NA, forming a thinned insulating layer 41 by partially removing the first insulating layer 40 exposed on the cell region CA and NMOS region NA, removing the mask pattern 25, and forming a second insulating layer 50. The interface between the first thinned insulating layer 41 and the second insulating layer 50 is marked by a dotted line.

Figure 9B:
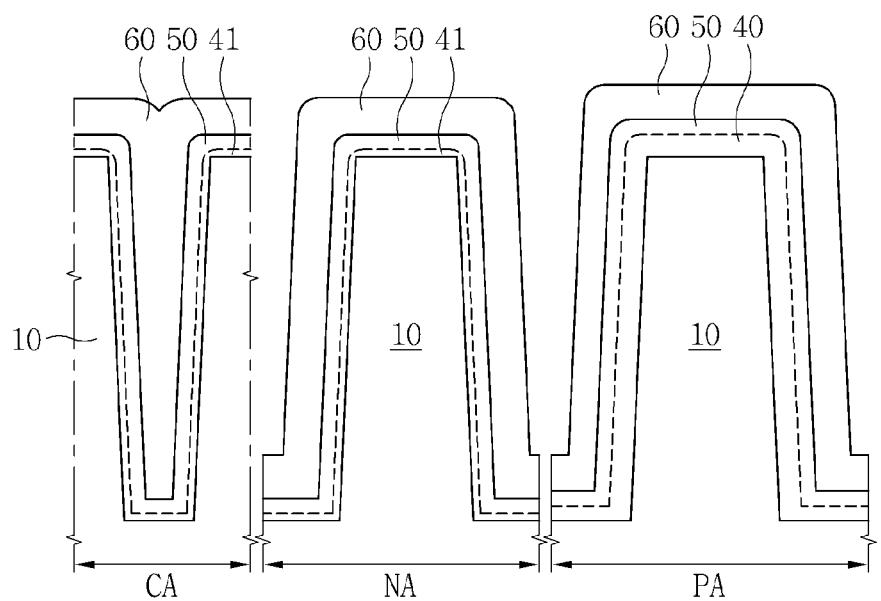

Referring to FIG. 9B, the method may include forming a third insulating layer 60 on the second insulating layer 50. The third insulating layer 60 may fully fill the cell field trench 30C. The third insulating layer 60 may be conformally formed on the second insulating layer 50 in the NMOS region NA and the PMOS region PA.

Figure 9C:
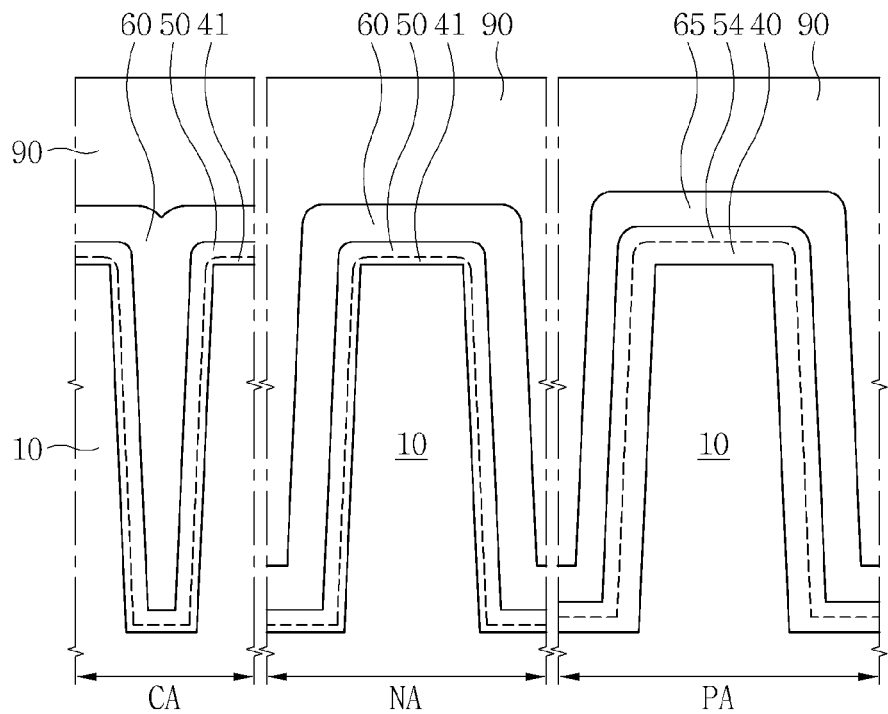

Referring to FIG. 9C, the method may include forming a filling insulating material 90 filling the NMOS field trench 30N and the PMOS field trench 30P, on the third insulating layer 60.

Figure 9D:
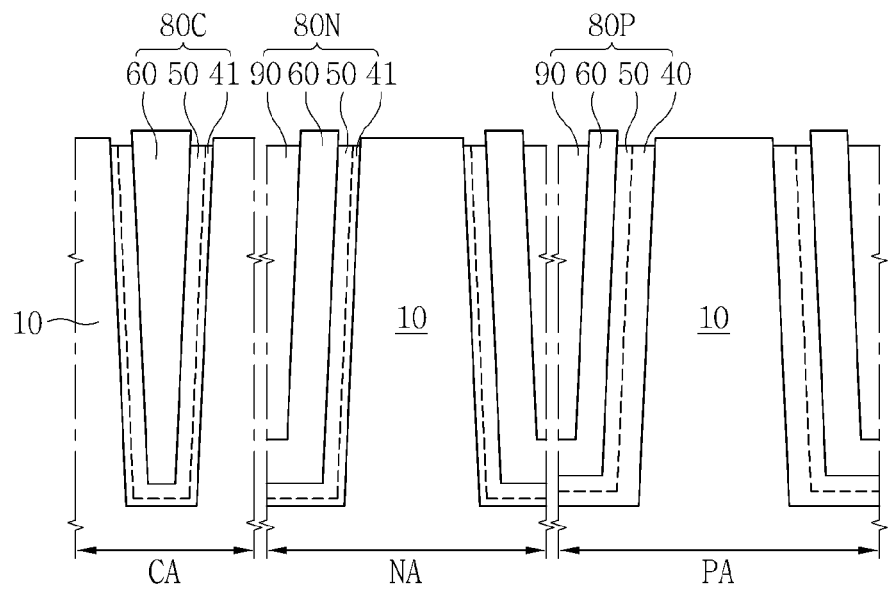

Referring to FIG. 9D, the method may include partially removing upper portions of the filling insulating material 90, the third insulating layer 60, the second insulating layer 50, the first insulating layer 40, and the first thinned insulating layer 41 to expose the surface of the substrate 10 by performing a planarization process. Upper ends of the second insulating layer 50 and the first thinned insulating layer 41 may be located lower than an upper surface of the third insulating layer 60 and/or the surface of the substrate 10. In the cell region CA, the first thinned insulating layer 41, the second insulating layer 50, and the third insulating layer 60 may form a cell field insulating material 80C. In the NMOS region NA, the first thinned insulating layer 41, the second insulating layer 50, the third insulating layer 60, and the filling insulating material 90 may form an NMOS field insulating material 80N. In the PMOS region PA, the first insulating layer 40, the second insulating layer 50, the third insulating layer 60, and the filling insulating material 90 may form a PMOS field insulating material 80P. Successively, processes of forming a gate insulating layer, a tunneling insulating layer, or an interlayer insulating layer may be performed.

FIGS. 10A to 10H are schematic cross-sectional views for describing a method of fabricating a semiconductor device in accordance with a yet further example embodiment of the inventive concepts.

Figure 10A:
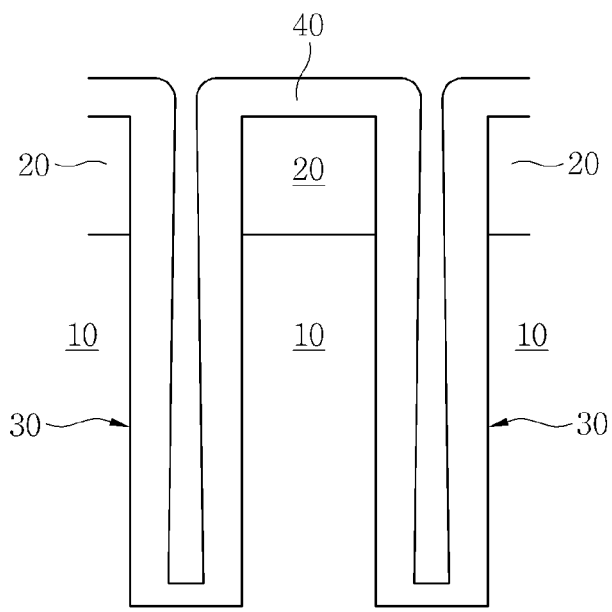

Referring to FIG. 10A, the method of fabricating a semiconductor device of the exemplary embodiment may include forming a trench mask 20 on the substrate 10, forming a field trench 30, and forming a first insulating layer 40. The trench mask 20 may include a mono- or multi-layered inorganic material. For example, the trench mask 20 may include an inorganic material such as silicon oxide, spin-on-hardmask (SOH), silicon nitride, or silicon oxynitride. The trench mask 20 may expose a part of the substrate 10. The field trench 30 may be formed by selectively etching the part of the substrate 10 using the trench mask 20 as an etch mask. Although inner walls of the field trench 30 are tapered, the embodiments are described assuming that the inner walls are vertical, for a better understanding of the inventive concepts.

The first insulating layer 40 may be conformally formed on inner walls and bottom of the field trench 30, and sidewalls and upper surface of the trench mask 20. The first insulating layer 40 may be formed in such a way that the thickness decreases toward the bottom of the field trench 30 and increases toward the upper surface of the trench mask 20. The first insulating layer 40 may be formed using an ALD method. The first insulating layer 40 may include silicon oxide, silicon nitride, or silicon oxynitride. A thermal stabilization process is performed after forming the first insulating layer 40. By the thermal stabilization process, the interface between the field trench 30 and the first insulating layer 40 may be oxidized and thereby interfacial properties and bonding characteristics of the substrate 10 and first insulating layer 40 may be improved. The thermal stabilization process may be omitted.

Figure 10B:
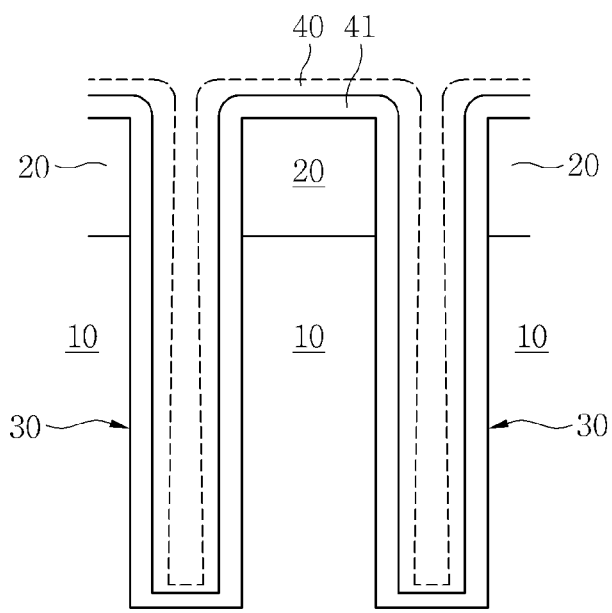

Referring to FIG. 10B, the method may include forming a first thinned insulating layer 41 by partially removing a surface of the first insulating layer 40. The thermal stabilization process may be performed after forming the first thinned insulating layer 41. The first insulating layer 40 before being removed is virtually marked by a dotted line. The closer to the bottom of the field trench 30, the less the first insulating layer 40 may be removed. The closer to the top of the trench mask 20, the more the first insulating layer 40 may be removed. The partial removal of the surface of the first insulating layer 40 may include a wet-etch process using an etchant such as HF, BOE, or $H_3PO_4$, and/or a dry-etch process using a gas including C and F.

Figure 10C:
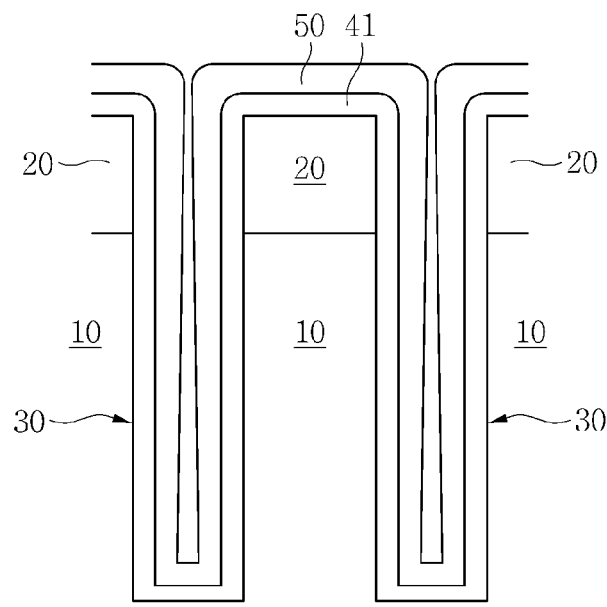

Referring to FIG. 10C, the method may include forming a second insulating layer 50 on the first thinned insulating layer 41. The second insulating layer 50 may be formed using an ALD method. The second insulating layer 50 may include silicon oxide, silicon nitride, or silicon oxynitride. For example, the first insulating layer 40 and the second insulating layer 50 may include a different material from each other. The second insulating layer 50 may also be formed to be thinner toward the bottom of the field trench 30 and thicker toward the top of the trench mask 20.

Figure 10D:
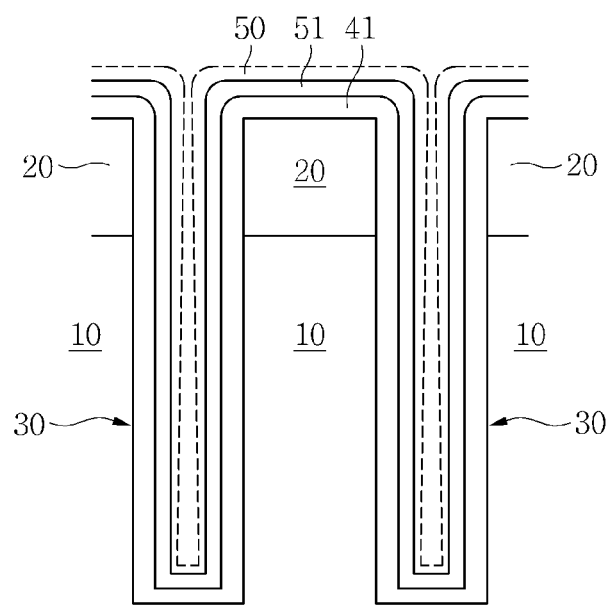

Referring to FIG. 10D, the method may include forming a second thinned insulating layer 51 by partially removing a surface of the second insulating layer 50. The closer to the bottom of the field trench 30, the less the second insulating layer 50 may removed. The closer to the top of the trench mask 20, the more the second insulating layer 50 may removed. The partial removal of the surface of the second insulating layer 50 may include a wet-etch process using an etchant such as HF, BOE, or $H_3PO_4$, and/or a dry-etch process using a gas including C and F. The second insulating layer 50 before being removed is virtually marked by a dotted line.

Figure 10E:
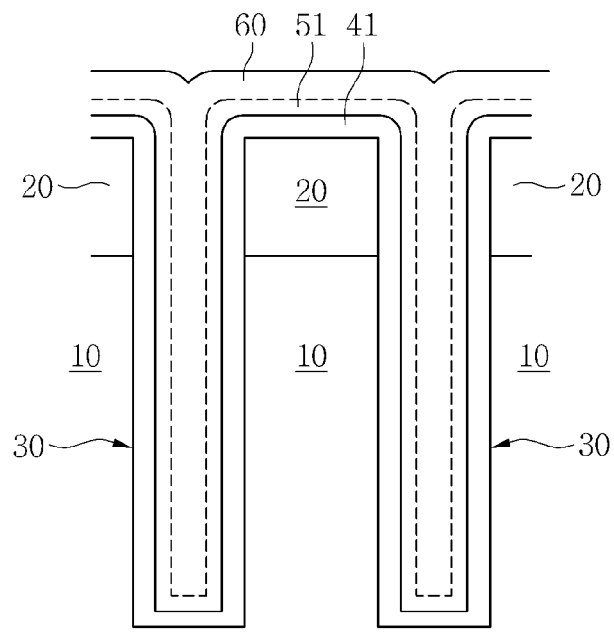

Referring to FIG. 10E, the method may include forming a third insulating layer 60 on the second thinned insulating layer 51. The third insulating layer 60 may fully fill the field trench 30. The third insulating layer 60 may include silicon oxide, silicon nitride, or silicon oxynitride. The third insulating layer 60 may be formed using an ALD process, a CVD process, or a gap-fill process. The interface between the second thinned insulating layer 51 and the second insulating layer 50 is marked by a dotted line.

Figure 10F:
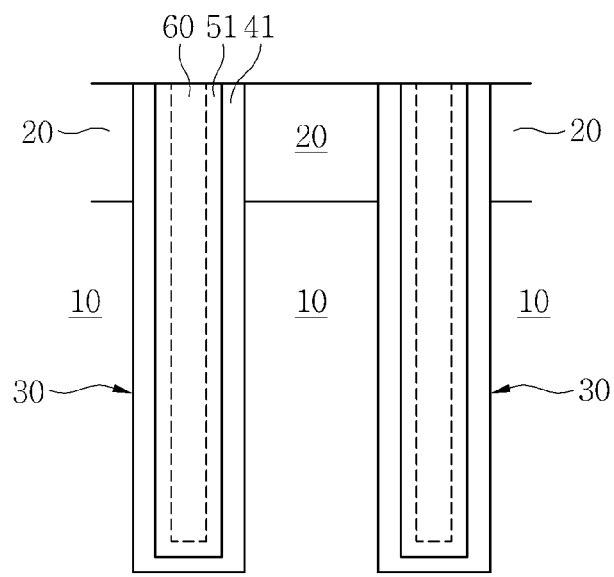

Referring to FIG. 10F, the method may include removing upper portions of the third insulating layer 60, the second thinned insulating layer 51, and the first thinned insulating layer 41 by performing a planarization process to expose the upper surface of the trench mask 20. The planarization process may include a CMP process and/or an etchback process.

Figure 10G:
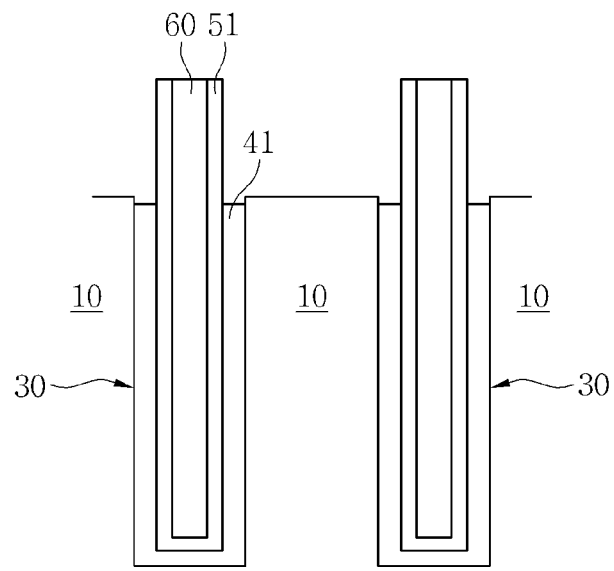

Referring to FIG. 10G, the method may include removing the trench mask 20. The trench mask 20 may be removed by a wet-etch process using a diluted HF, or a dry-etch process using a gas including C and F. In this process, an upper end of the first thinned insulating layer 41 may become lower than the surface of the substrate 10.

Figure 10H:
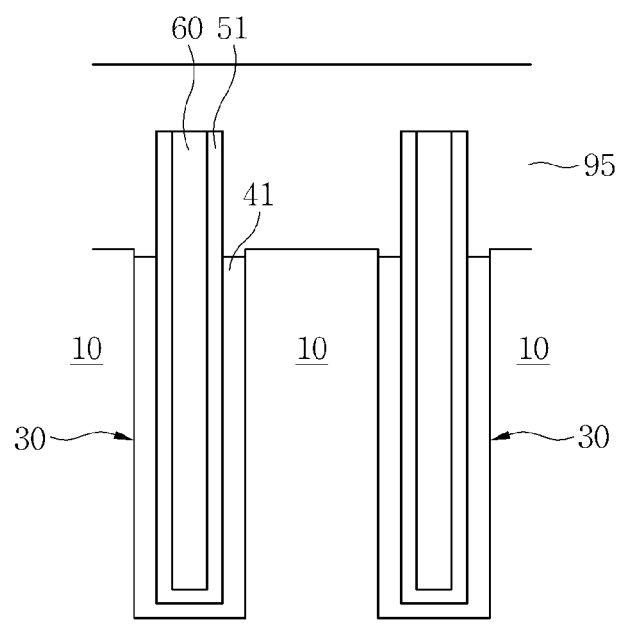

Referring to FIG. 10H, the method may include forming an interlayer insulating layer 95 overall. The interlayer insulating layer 95 may be thickly formed using a CVD process or a coating process. The interlayer insulating layer 95 may include silicon oxide. Successively, a planarization process, a selective etch process, or a deposition process, etc. may be performed.

The method of fabricating a semiconductor device in accordance with the embodiment of the inventive concepts may provide a void-free STI in the field trench 30, because the first thinned insulating layer 41 and the second thinned insulating layer 51 are conformally formed on the inner wall of the field trench 30 by repeatedly performing each the process of depositing and partially removing the first insulating layer 40 and the second insulating layer 50 in the field trench 30.

Figure 11A:
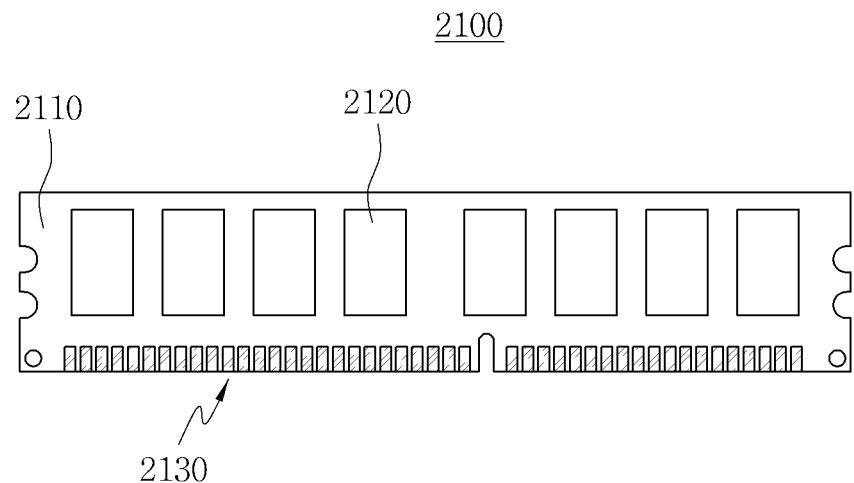
FIGS. 11A to 11E are schematic views showing a memory module, a memory card, electronic systems, and a mobile apparatus including at least one of semiconductor devices fabricated in accordance with various example embodiments of the inventive concepts.

FIG. 11A is a conceptual diagram showing a memory module including at least one of semiconductor devices fabricated in accordance with various embodiments of the inventive concepts.

Referring to FIG. 11A, a memory module 2100 may include a memory module substrate 2110, a plurality of memory devices 2120 arranged on the memory module substrate 2110, and a plurality of terminals 2130. The memory module substrate 2110 may include a printed circuit board (PCB) or a wafer. The memory devices 2120 may include at least one of semiconductor devices fabricated in accordance with various embodiments of the inventive concepts. The plurality of terminals 2130 may include a conductive metal. Each terminal may be electrically connected to each memory device 2120.

Figure 11B:
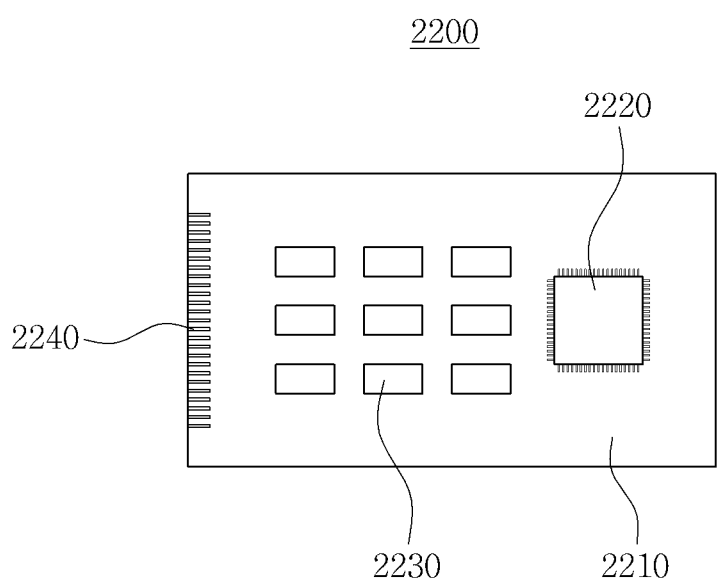

FIG. 11B is a conceptual diagram showing a memory card including at least one of semiconductor devices fabricated in accordance with various embodiments of the inventive concepts.

Referring to FIG. 11B, a memory card 2200 in accordance with an example embodiment of the inventive concepts may include at least one of semiconductor devices fabricated in accordance with various example embodiments of the inventive concepts, mounted on a memory card substrate 2210. The memory card 2200 may further include a microprocessor 2220 mounted on the memory card substrate 2210. Input/output terminals 2240 may be arranged on at least one edge of the memory card substrate 2210.

Figure 11C:
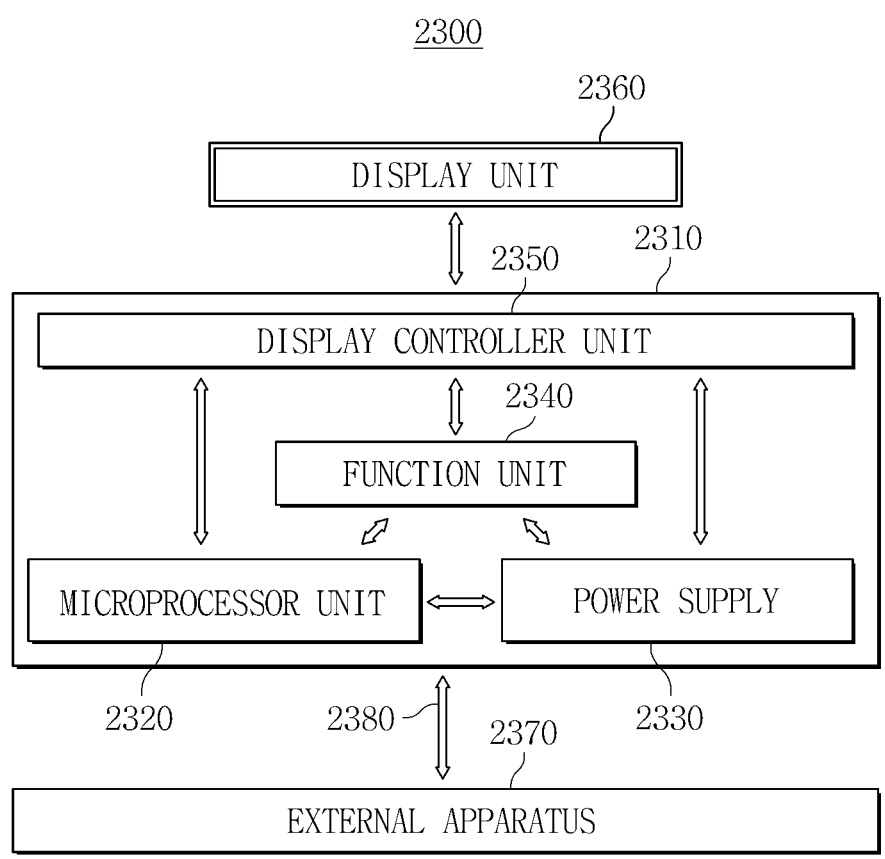

FIG. 11C is a conceptual diagram showing an electronic system including at least one of semiconductor devices fabricated in accordance with various example embodiments of the inventive concepts.

Referring to FIG. 11C, the semiconductor devices 10 and 20 in accordance with various example embodiments of the inventive concepts may be applied in the electronic system 2300. The electronic system 2300 may include a body 2310. The body 2310 may include a microprocessor unit 2320, a power supply 2330, a function unit 2340, and/or a display controller unit 2350. The body 2310 may be a system board or a motherboard including a printed circuit board (PCB), etc. The microprocessor unit 2320, the power supply 2330, the function unit 2340, and the display controller unit 2350 may be mounted or installed on the body 2310. A display unit 2360 may be arranged on an upper surface or an outside of the body 2310. For example, the display unit 2360 may be arranged on a surface of the body 2310 and display an image processed by the display controller unit 2350. The power supply 2330 may receive a constant voltage from an external power source, etc., divide the voltage into various levels, and supply those voltages to the microprocessor unit 2320, the function unit 2340, and the display controller unit 2350, etc. The microprocessor unit 2320 may receive a voltage from the power supply 2330 to control the function unit 2340 and the display unit 2360. The function unit 2340 may perform various functions of the electronic system 2300. For example, when the electronic system 2300 is a mobile electronic apparatus such as a mobile phone, the function unit 2340 may have several components which can perform functions of a mobile phone such as dialing, video output to the display unit 2360 through communication with an external apparatus 2370, and sound output to a speaker, and if a camera is installed, the function unit 2340 may function as an image processor. In the example embodiment to which the inventive concepts is applied, when the electronic system 2300 is connected to a memory card, etc. in order to expand capacity, the function unit 2340 may be a memory card controller. The function unit 2340 may exchange signals with the external apparatus 2370 through a wired or wireless communication unit 2380. In addition, when the electronic system 2300 needs a universal serial bus (USB), etc. in order to expand functionality, the function unit 2340 may function as an interface controller. At least one of the semiconductor devices fabricated in accordance with various example embodiments of the inventive concepts may be included in at least one of the microprocessor unit 2320 and the function unit 2340.

Figure 11D:
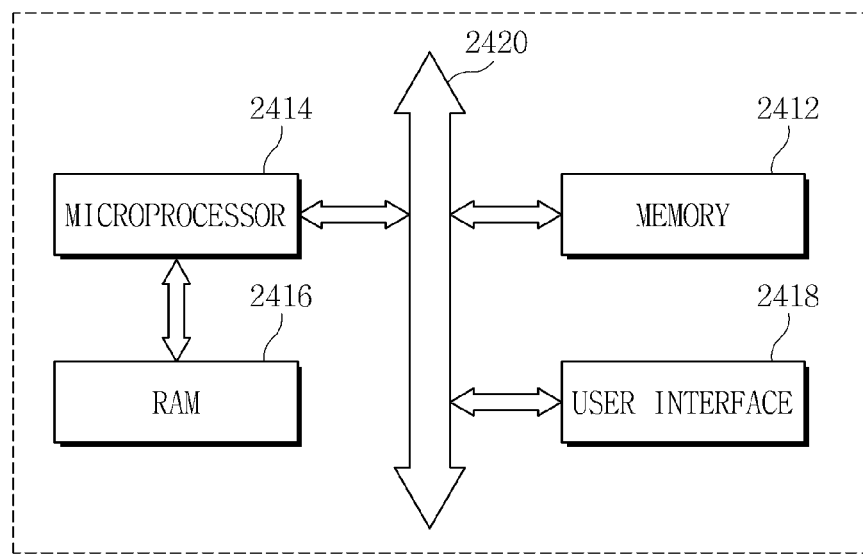

FIG. 11D is a block diagram schematically showing another electronic system including at least one of the semiconductor devices fabricated in accordance with various example embodiments of the inventive concepts.

Referring to FIG. 11D, an electronic system 2400 may include at least one of semiconductor devices fabricated in accordance with various embodiments of the inventive concepts. The electronic system 2400 may be used to fabricate a mobile apparatus or a computer. For example, the electronic system 2400 may include a memory system 2412, a microprocessor 2414 performing data communication using a bus 2420, a random access memory (RAM) 2416, and a user interface 2418. The microprocessor 2414 may program and control the electronic system 2400. The RAM 2416 may be used as an operation memory of the microprocessor 2414. For example, the microprocessor 2414 or the RAM 2416 may include at least one of semiconductor devices fabricated in accordance with various embodiments of the inventive concepts. The microprocessor 2414, the RAM 2416, and/or other components can be assembled in a single package. The user interface 2418 may be used to input/output data to/from the electronic system 2400. The memory system 2412 may store codes for operating the microprocessor 2414, data processed by the microprocessor 2414, or external input data. The memory system 2412 may include a controller and a memory device.

Figure 11E:
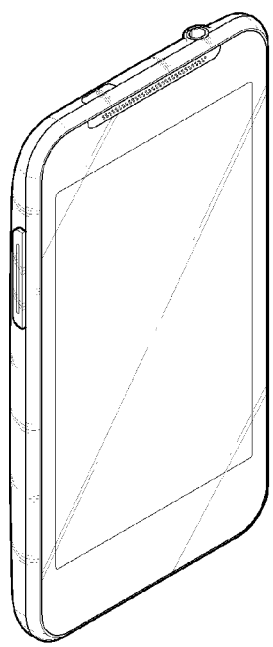

FIG. 11E is a view schematically showing a mobile wireless phone including at least one of semiconductor devices fabricated in accordance with various example embodiments of the inventive concepts. The mobile wireless phone 2500 may be understood as a tablet PC. In addition, at least one of semiconductor devices fabricated in accordance with various embodiments of the inventive concepts may be used in a portable computer such as a notebook, an MPEG-1 Audio Layer 3 (MP3) player, an MP4 player, a navigation apparatus, a solid state disk (SSD), a desktop computer, an automobile, or a home appliance, as well as a tablet PC.

The methods of fabricating a semiconductor device in accordance with various embodiments of the inventive concepts may provide a method of forming a void-free field insulating material. Accordingly, the semiconductor device fabricated by various manufacturing methods of the inventive concepts may have improved and stabilized insulating and electrical characteristics, thermal durability, and a high-yielding manufacturing process.

The foregoing is illustrative of embodiments and is not to be construed as limiting thereof. Although a few embodiments have been described, those skilled in the art will readily appreciate that many modifications are possible without materially departing from the novel teachings. Accordingly, all such modifications are intended to be included within the scope of the inventive concepts as defined in the claims.

What is claimed is:

1. A method of fabricating a semiconductor device, comprising:
    forming a field trench in a silicon substrate;
    forming a first oxide layer in the field trench, the first oxide layer being on an inner wall and a bottom of the field trench;
    forming a first thinned oxide layer by partially removing a surface of the first oxide layer, the first thinned oxide layer being disposed on the inner wall and the bottom of the field trench; and
    forming a first nitride layer on the first thinned oxide layer to fill in the field trench.

2. The method of claim 1, wherein the forming the first oxide layer includes depositing silicon oxide using an atomic layer deposition (ALD) method.

3. The method of claim 1, further comprising:
performing an oxidation process for supplying an oxygen ion or an oxygen radical in the silicon substrate through the first oxide layer, after the forming the first oxide layer.

4. The method of claim 1, wherein the partially removing the surface of the first oxide layer includes processing the surface of the first oxide layer using a wet etching solution including HF.

5. The method of claim 1, wherein the forming the first nitride layer includes depositing silicon nitride using an atomic layer deposition (ALD) method.

6. The method of claim 1, further comprising:
forming a first thinned nitride layer by partially removing a surface of the first nitride layer.

7. The method of claim 6, wherein the partially removing the surface of the first nitride layer includes processing the surface of the first nitride layer using a wet etching solution including $H_3PO_4$.

8. The method of claim 6, further comprising:
forming a second nitride layer fully filling the field trench on the first thinned nitride layer.

9. The method of claim 8, wherein the forming the second nitride layer includes depositing silicon nitride using an atomic layer deposition (ALD) method.

10. The method of claim 1, further comprising:
forming a second oxide layer on the first thinned oxide layer, before the forming the first nitride layer.

11. The method of claim 1, wherein the forming the field trench comprises:
forming a trench mask including silicon oxide or silicon nitride on the silicon substrate.

12. The method of claim 1, further comprising:
removing an upper portion of the first nitride layer to expose the first thinned oxide layer; and
selectively removing the first thinned oxide layer to expose a surface of the silicon substrate,
wherein an upper end of the first thinned oxide layer is lower than the surface of the silicon substrate.

13. A method of fabricating a semiconductor device, comprising:
providing a substrate having a cell region, an NMOS region, and a PMOS region;
forming a cell field trench, an NMOS field trench, and a PMOS field trench in regions of the substrate corresponding to the cell region, the NMOS region, and the PMOS region, respectively;
forming a first oxide layer in the cell field trench, the NMOS field trench, and the PMOS field trench;
forming a mask pattern exposing the cell field trench and the NMOS field trench, the mask pattern covering the PMOS field trench;
forming a first thinned oxide layer by partially removing a surface of the first oxide layer exposed in the cell field trench and the NMOS field trench;
removing the mask pattern; and
forming a first nitride layer on the first thinned oxide layer disposed in the cell field trench and the NMOS field trench, the first nitride layer being on the first oxide layer disposed in the PMOS field trench.

14. The method of claim 13, wherein the forming the first nitride layer includes fully filling the cell field trench, and conformally forming the first nitride layer on the first thinned oxide layer disposed in the NMOS field trench, and on the first oxide layer disposed in the PMOS field trench.

15. The method of claim 13, further comprising:
forming a silicon oxide layer fully filling the NMOS field trench and the PMOS field trench.

16. A method of fabricating a semiconductor device, comprising:
forming an insulative pattern structure filling a field trench in a silicon substrate, the forming an insulative pattern structure including,
reducing a first insulating layer at least partially filling the field trench to form a first insulating pattern, and
forming at least one nitride layer over the first insulating pattern and in the field trench.

17. The method of claim 16, wherein the reducing a first insulating layer includes etching a surface of the first insulating layer such that the first insulating pattern is conformally formed on a surface of the field trench.

18. The method of claim 16, further comprising:
removing a portion of the insulating pattern so as to expose an upper surface of the substrate,
the removing a portion of the insulating pattern including etching an uppermost end of the insulating pattern in the field trench to be lower than at least one selected from an upper surface the at least one nitride layer and the upper surface of the substrate.

19. The method of claim 18, further comprising:
reducing a second insulating layer at least partially filling the field trench to form a second insulating pattern conformally on a surface of the field trench, before the forming at least one nitride layer,
the removing a portion of the insulating pattern including etching an uppermost end of the second insulating layer in the field trench to be lower than at least one selected from the upper surface the at least one nitride layer and the upper surface of the substrate.

20. The method of claim 18, wherein the forming at least one nitride layer over the insulating pattern includes,
forming a first nitride layer on the insulating pattern,
reducing the first nitride layer to form a first nitride pattern conformally formed on a surface of the insulating pattern, the insulating pattern and the first nitride pattern partially filling the field trench, and
forming a second nitride layer filling a remaining portion of the field trench.

* * * * *